US010812109B2

(12) United States Patent
Kern et al.

(10) Patent No.: US 10,812,109 B2
(45) Date of Patent: Oct. 20, 2020

(54) DETERMINATION AND USE OF BYTE ERROR POSITION SIGNALS

(71) Applicant: Infineon Technologies AG, Neubiberg (DE)

(72) Inventors: Thomas Kern, Ascheim (DE); Christian Badack, Unterhaching (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 47 days.

(21) Appl. No.: 16/178,901

(22) Filed: Nov. 2, 2018

(65) Prior Publication Data

US 2019/0132006 A1  May 2, 2019

(30) Foreign Application Priority Data

Nov. 2, 2017 (DE) .................. 10 2017 125 617

(51) Int. Cl.
*H03M 13/15* (2006.01)

(52) U.S. Cl.
CPC ... *H03M 13/1575* (2013.01); *H03M 13/1515* (2013.01)

(58) Field of Classification Search
CPC .............. H03M 13/1575; H03M 13/1515
See application file for complete search history.

(56) References Cited

U.S. PATENT DOCUMENTS

| 4,730,321 | A | * | 3/1988 | Machado | ............... H03M 13/15 360/40 |
| 5,563,894 | A | | 10/1996 | Fujiwara et al. | |
| 5,754,563 | A | * | 5/1998 | White | ................. H03M 13/151 708/492 |
| 6,078,632 | A | * | 6/2000 | Cesulka | ................. G08C 17/02 375/368 |
| 6,414,957 | B1 | * | 7/2002 | Kang | .................. H04L 12/5601 370/395.1 |
| 6,738,947 | B1 | * | 5/2004 | Maeda | .............. H03M 13/1515 714/785 |
| 2004/0153902 | A1 | * | 8/2004 | Machado | ............ G06F 11/1068 714/710 |
| 2009/0106633 | A1 | * | 4/2009 | Fujiwara | ............... H03M 13/13 714/785 |

(Continued)

OTHER PUBLICATIONS

Chowdhury, D.R., et al., "CA-Based Byte Error-Correcting Code", IEEE Transactions on Computers, vol. 44, No. 3. Mar. 1995, pp. 371-382. (Year: 1995).*

(Continued)

Primary Examiner — Kyle Vallecillo
(74) Attorney, Agent, or Firm — Schiff Hardin LLP

(57) ABSTRACT

A circuit arrangement for determining in parallel of at least two byte error position signals for identifying at least one byte error in a binary sequence comprising a plurality of bytes, wherein the binary sequence in the error-free case is a code word of an error code, the circuit arrangement is configured such that each of the at least two byte error position signals is determinable using components of an error syndrome of the error code such that the components indicate whether or not a byte of the binary sequence that is associated with the byte error position signal is erroneous.

25 Claims, 13 Drawing Sheets

(56) References Cited

U.S. PATENT DOCUMENTS

Figure 1:
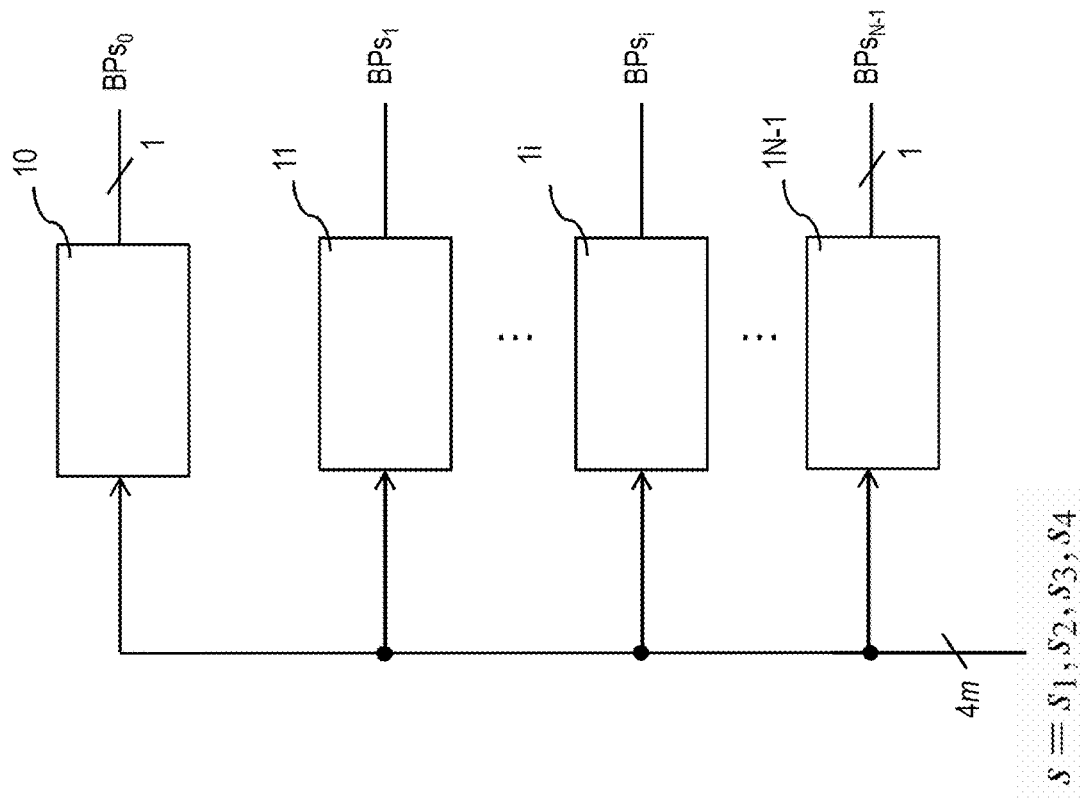

2011/0231737 A1* 9/2011 Dachiku ............. G06F 11/1044
714/770
2011/0280575 A1* 11/2011 Bleck ........................ H04J 3/14
398/58

OTHER PUBLICATIONS

German Patent Office, Office Action issued for DE 102017125617. 2, 6 pgs., dated Jul. 30, 2018.
The Decoding of BCH and Reed-Solomon Codes, Chapter 9, Section 9.2, "Decoding Algorithms for Nonbinary BCH and Reed-Solomon Codes", 11 pages.
BCH Codes, Chapter 6, Section 6.5, "Nonbinary BCH Codes and Reed-Solomon Codes", 8 pages.
D. C. Bossen, b-Adjacent Error Correction, 7 pgs., Jul. 1970.
H. Okano, et al., "A Construction Method of High-Speed Decoders Using ROM's for Bose-Chaudhuri-Hocquenghem and Reed-Solomon Codes", IEEE Transactions on Computers, vol. C-36, No. 10, 7 pgs., Oct. 1987.
E. Fujiwara, "Code Design for Dependable Systems: Theory and Practical Applications", Section 2.3.6, 2 pgs., Wiley-Interscience, 2 pgs., 2006.

\* cited by examiner

Fig.13

| Potenzdarstellung | Polynomdarstellung | Tupeldarstellung |
|---|---|---|
| — | 0 | (00000) |
| $\alpha^0$ | 1 | (10000) |
| $\alpha^1$ | $x^1$ | (01000) |
| $\alpha^2$ | $x^2$ | (00100) |
| $\alpha^3$ | $x^3$ | (00010) |
| $\alpha^4$ | $x^4$ | (00001) |
| $\alpha^5$ | $1+x^2$ | (10100) |
| $\alpha^6$ | $x^1+x^3$ | (01010) |
| $\alpha^7$ | $x^2+x^4$ | (00101) |
| $\alpha^8$ | $1+x^2+x^3$ | (10110) |
| $\alpha^9$ | $x^1+x^3+x^4$ | (01011) |
| $\alpha^{10}$ | $1+x^4$ | (10001) |
| $\alpha^{11}$ | $1+x^1+x^2$ | (11100) |
| $\alpha^{12}$ | $x^1+x^2+x^3$ | (01110) |
| $\alpha^{13}$ | $x^2+x^3+x^4$ | (00111) |
| $\alpha^{14}$ | $1+x^2+x^3+x^4$ | (10111) |
| $\alpha^{15}$ | $1+x^1+x^2+x^3+x^4$ | (11111) |
| $\alpha^{16}$ | $1+x^1+x^3+x^4$ | (11011) |
| $\alpha^{17}$ | $1+x^1+x^4$ | (11001) |
| $\alpha^{18}$ | $1+x^1$ | (11000) |
| $\alpha^{19}$ | $x^1+x^2$ | (01100) |
| $\alpha^{20}$ | $x^2+x^3$ | (00110) |
| $\alpha^{21}$ | $x^3+x^4$ | (00011) |
| $\alpha^{22}$ | $1+x^2+x^4$ | (10101) |
| $\alpha^{23}$ | $1+x^1+x^2+x^3$ | (11110) |
| $\alpha^{24}$ | $x^1+x^2+x^3+x^4$ | (01111) |
| $\alpha^{25}$ | $1+x^3+x^4$ | (10011) |
| $\alpha^{26}$ | $1+x^1+x^2+x^4$ | (11101) |
| $\alpha^{27}$ | $1+x^1+x^3$ | (11010) |
| $\alpha^{28}$ | $x^1+x^2+x^4$ | (01101) |
| $\alpha^{29}$ | $1+x^3$ | (10010) |
| $\alpha^{30}$ | $x^1+x^4$ | (01001) |

DETERMINATION AND USE OF BYTE ERROR POSITION SIGNALS

It is known for errors in data present in the form of bytes to be detected byte by byte and to be corrected byte by byte. In this case, a byte can comprise at least two bits. At least one error in at least one bit of a byte is referred to as a byte error. If at least one bit of a byte is erroneous, a byte error is present. If only at least one bit of a single byte is erroneous, this corresponds to a 1-byte error.

The correction of 1-byte errors is described for example in [Bossen, D.: b-Adjacent Error Correction, IBM J. Res. Dev., July 1970, pages 402 to 408].

If bits of two different bytes are erroneous, this corresponds to a 2-byte error. Accordingly it holds true that a k-byte error is present if bits in k bytes are erroneous (i.e. at least one bit in each of the k bytes has an error).

It is a general motivation to carry out the error correction of possibly erroneous bytes rapidly. This holds true for example if data present in bytes are intended to be read out from a memory in parallel and to be provided in parallel. In such a scenario it may be advantageous also to carry out the error correction in parallel.

In this case, in parallel means, in particular, that an error correction or part of the error correction for at least two bytes is carried out at least partly simultaneously (for example also in a manner at least partly overlapping in time).

The byte error correction can be carried out for example by means of a Reed-Solomon code.

OKANO [Okano, H., Imai, H.: A Construction Method of High-Speed Decoders Using ROM's for Bose-Chaudhuri-Hocquengiem and Reed-Solomon codes, IEEE TRANSACTIONS ON COMPUTERS, VOL. C-36, NO. 10, OCTOBER 1987, pages 1165 to 1171] describes a circuit arrangement for correcting 2-byte errors using a Reed-Solomon code. What is disadvantageous here is that the correction of 2-byte errors as described in OKANO is comparatively slow.

The object of the disclosure is to avoid disadvantages of known solutions for correcting byte errors and in particular to enable an error correction of errors in a plurality of bytes that is as rapid as possible.

In particular, it is an object to provide an error correction of m-byte errors where m≥2 for memory cells, e.g. MRAM memory cells, RRAM memory cells, etc., and thus to increase the reliability of data read out from the memory cells.

This object is achieved in accordance with the features of the independent claims. Preferred embodiments can be gathered in particular from the dependent claims.

For achieving the object a circuit arrangement is proposed for determining at least two byte error position signals for identifying at least one byte error in a binary sequence comprising a plurality of bytes, wherein the binary sequence in the error-free case is a code word of an error code, wherein the circuit arrangement is configured in such a way that each of the at least two byte error position signals is determinable using components of an error syndrome of the error code in such a way that it indicates whether or not a byte of the binary sequence that is associated with the byte error position signal is erroneous, wherein the at least two byte error position signals are determined in parallel.

It should be noted here that respectively one byte error position signal can be determined per byte of the binary sequence. Consequently, one byte error position signal is linked or associated with each byte of the binary sequence. The value of the byte error position signal indicates whether or not the byte linked with the byte error position signal has an error.

The error code is for example an error-correcting and/or error-detecting code. By way of example, a Reed-Solomon code can be used as error code.

In this context, in parallel means, in particular, that values are determined at least partly in parallel with one another, that is to say for example simultaneously or at least partly simultaneously.

In one development, the circuit arrangement is configured in such a way that byte error position signals are determinable using components of an error syndrome of the error code in such a way that they indicate, for at least two bytes of the bytes of the binary sequence, that a correctable error is present.

In one development, the error code is a t-byte-error-correcting code, wherein at least (t+1) byte error position signals are determined in parallel.

In one development, the binary sequence has a 2-byte error.

In one development, each byte of the binary sequence has m bits, wherein m≥2 holds true.

In one development, the error code is a t-byte-error-correcting code or a t-byte-error-correcting and (t+1)-byte-error-detecting code, wherein t≥2 holds true.

In one development, the binary sequence has at least (t+1) correctable bytes.

In one development, the error syndrome has at least 2·t components $s_1, s_2, \ldots, s_{2t}$, wherein each component comprises in each case m bits where m≥2.

A correctable byte is a byte for which, in the case of a byte error in this byte, an error correction is provided if the byte error is correctable by means of the byte-error-correcting code.

In one development, the byte error position signal has a first value if the byte associated with the byte error position signal is erroneous, and has a second value if the byte associated with the byte error position signal is not erroneous.

In one development, at least one of byte error position signals is determined for at least one correct byte.

In one development, the binary sequence comprises data bytes and check bytes, wherein the data bytes and/or the check bytes form correctable bytes.

In particular, only data bytes can be corrected. It is also possible for only check bytes or for a combination of data bytes and check bytes to be corrected. In this case, data bytes can represent payload data and check bytes can represent additional check information that can be used for correcting the payload data.

Moreover, for achieving the object a circuit arrangement is proposed for correcting at least one byte error in a binary sequence comprising a plurality of bytes, wherein the binary sequence in the error-free case is a code word of an error code, wherein the circuit arrangement is configured for determining at least one byte error position signal using components of an error syndrome of the error code in such a way that by means of the byte error position signal it is determinable whether or not a byte of the binary sequence is erroneous, for determining at least one byte error correction value on the basis of which an erroneous byte position identified by means of the byte error position signal is correctable, wherein at least one of the byte error correction values is determined for at least one correct byte.

In one development, the at least one byte error position signal and/or at least one byte error correction value are/is determined in parallel.

In particular, at least two byte error correction values can be determined in parallel.

In one development the error code is a t-byte-error-correcting code, wherein at least (t+1) byte error position signals are determined in parallel.

In one development, the error code is a t-byte-error-correcting code, wherein at least (t+1) byte error correction values are determined in parallel.

In one development, the at least (t+1) byte error correction values are determined using at most three Galois field multipliers, and wherein t≥2 holds true.

In one development, the circuit arrangement is configured to correct one of the byte errors by logically combining the byte error position signal with the byte error correction value for the erroneous byte.

In one development, the circuit arrangement is configured for correcting t-byte errors, wherein t≥2 holds true.

In one development, the circuit arrangement is additionally configured for correcting 1-byte errors.

In one development, the circuit arrangement is additionally configured for correcting t-byte errors, wherein t≥τ>2 holds true.

In one development, in the case of a 2-byte error, the i-th byte is a correctable byte, wherein the byte error position signal for the i-th byte assumes a first value if $$\alpha^{2i}\{s_1 s_3 + s_2^2\} \alpha^i \{s_1 s_4 + s_2 s_3\} + s_2 s_4 + s_3^2 = 0$$

hold true and wherein the byte error position signal for the i-th byte assumes a second value if $$\alpha^{2i}\{s_1 s_3 + s_2^2\} \alpha^i \{s_1 s_4 + s_2 s_3\} + s_2 s_4 + s_3^2 \neq 0$$

holds true, wherein the i-th byte is erroneous if the byte error position signal associated with the i-th byte assumes the first value.

In one development, in the case of a 2-byte error, the byte error correction value of the i-th byte is determined in accordance with $$a(i) = \frac{s_1 s_3 + s_2^2}{s_3 + \alpha^{2i} s_1}.$$

The circuit arrangement can be subdivided into individual subcircuit arrangements. In particular, it is possible for the circuit arrangement described here to be realized in integral or multipartite fashion.

Furthermore, the circuit arrangement can be realized using a synthesis tool.

In one development, in the case of a 2-byte error, the correction of a correctable byte is determined depending on three components of the error syndrome and on the byte error position signal.

Moreover, a method is specified for determining at least two byte error position signals for identifying at least one byte error in a binary sequence comprising a plurality of bytes, wherein the binary sequence in the error-free case is a code word of an error code, wherein each of the at least two byte error position signals is determined using components of an error syndrome of the error code in such a way that it indicates whether or not a byte of the binary sequence that is associated with the byte error position signal is erroneous, wherein the at least two byte error position signals are determined in parallel.

Furthermore, a method is proposed for correcting at least one byte error in a binary sequence comprising a plurality of bytes, wherein the binary sequence in the error-free case is a code word of an error code, comprising the following steps:

determining at least one byte error position signal using components of an error syndrome of the error code in such a way that, owing to the byte error position signal, it is determinable whether or not a byte of the binary sequence is erroneous, determining at least one byte error correction value on the basis of which an erroneous byte position identified by means of the byte error position signal is corrected, wherein at least one of the byte error correction values is determined for at least one correct byte.

The above-described properties, features and advantages of this disclosure and the way in which they are achieved are described below in association with a schematic description of exemplary embodiments which are explained in greater detail in association with the drawings. In this case, for the sake of clarity, identical or identically acting elements may be provided with identical reference signs.

DRAWINGS

Figure 2:
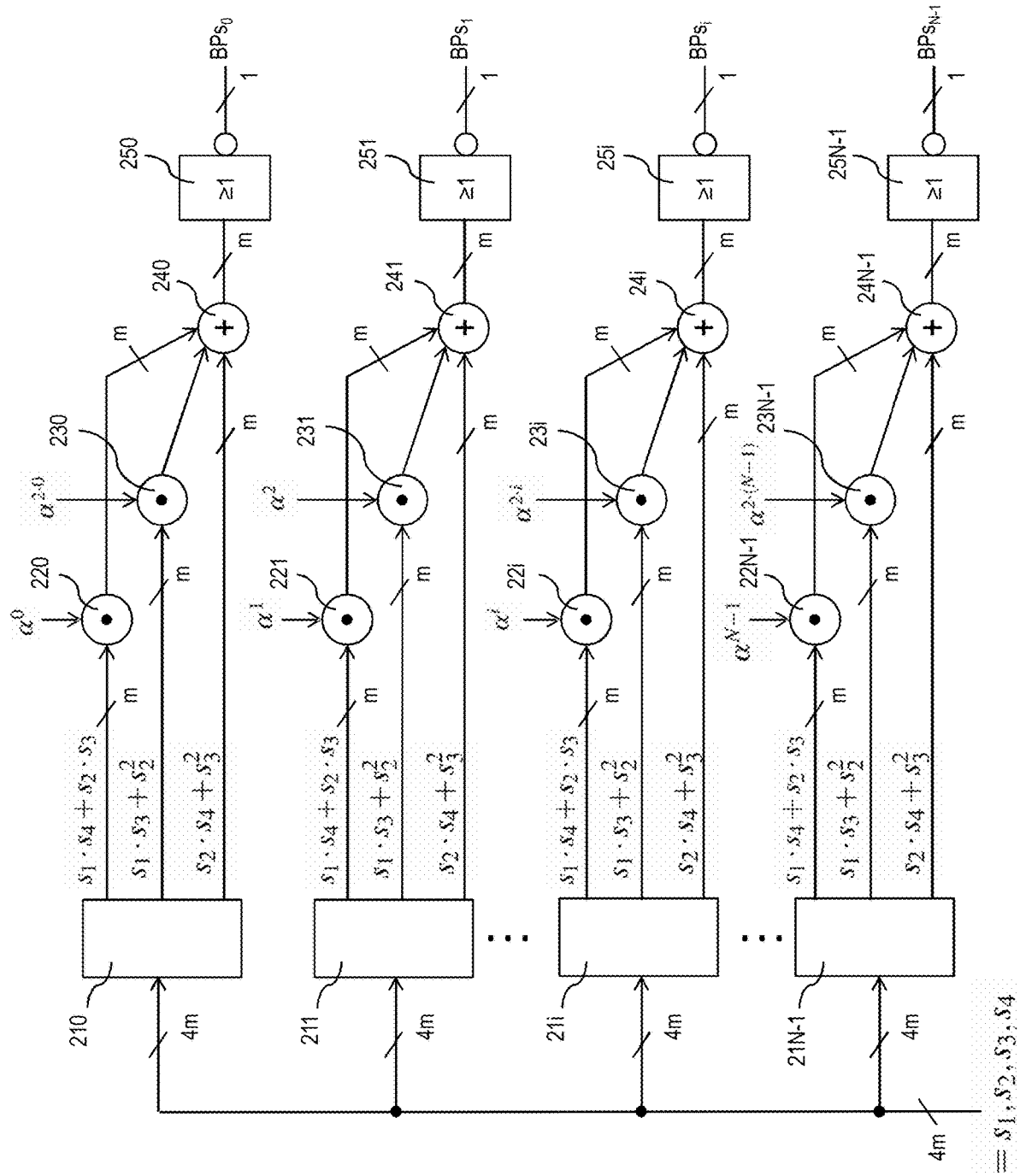
Figure 3:
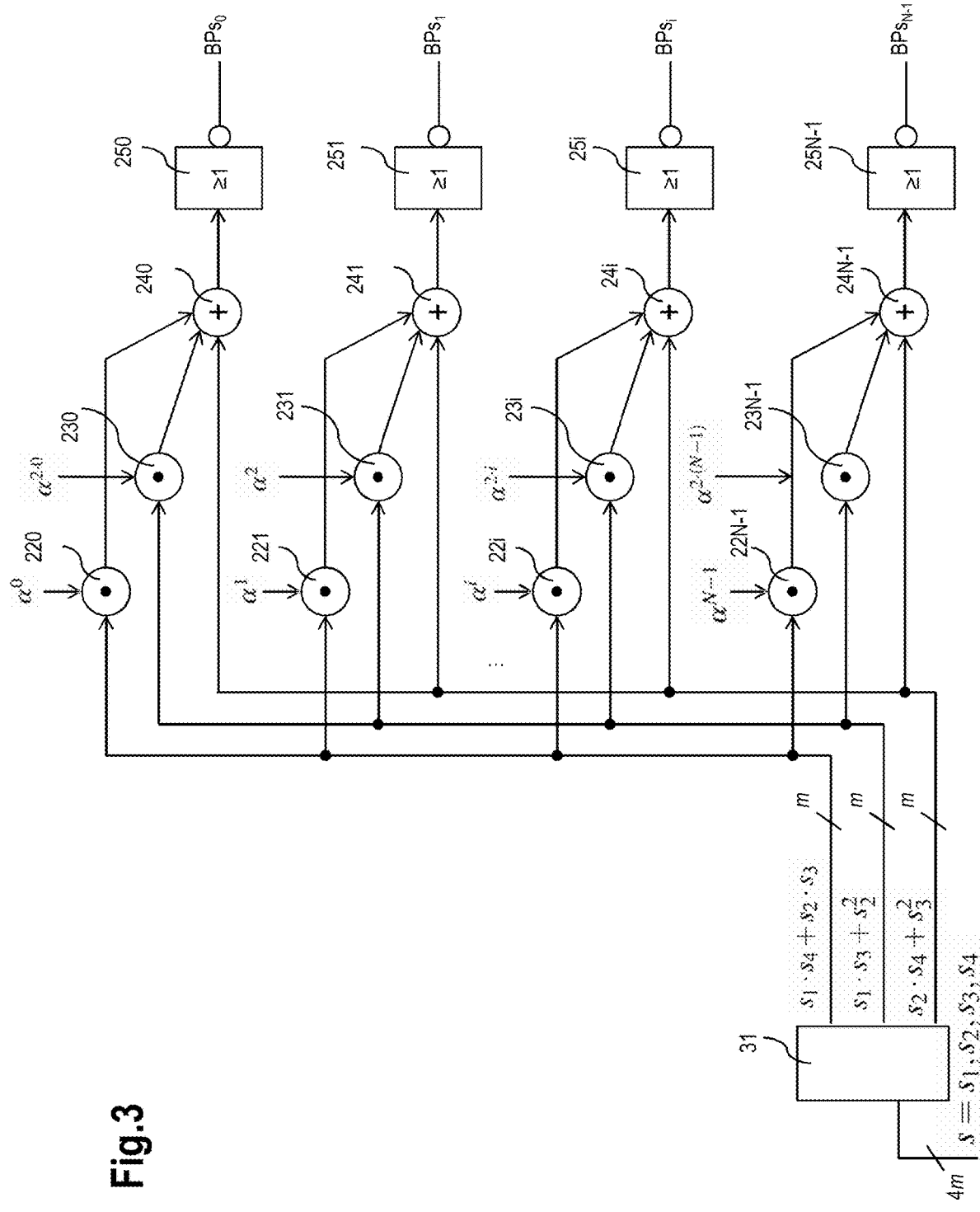
Figure 4:
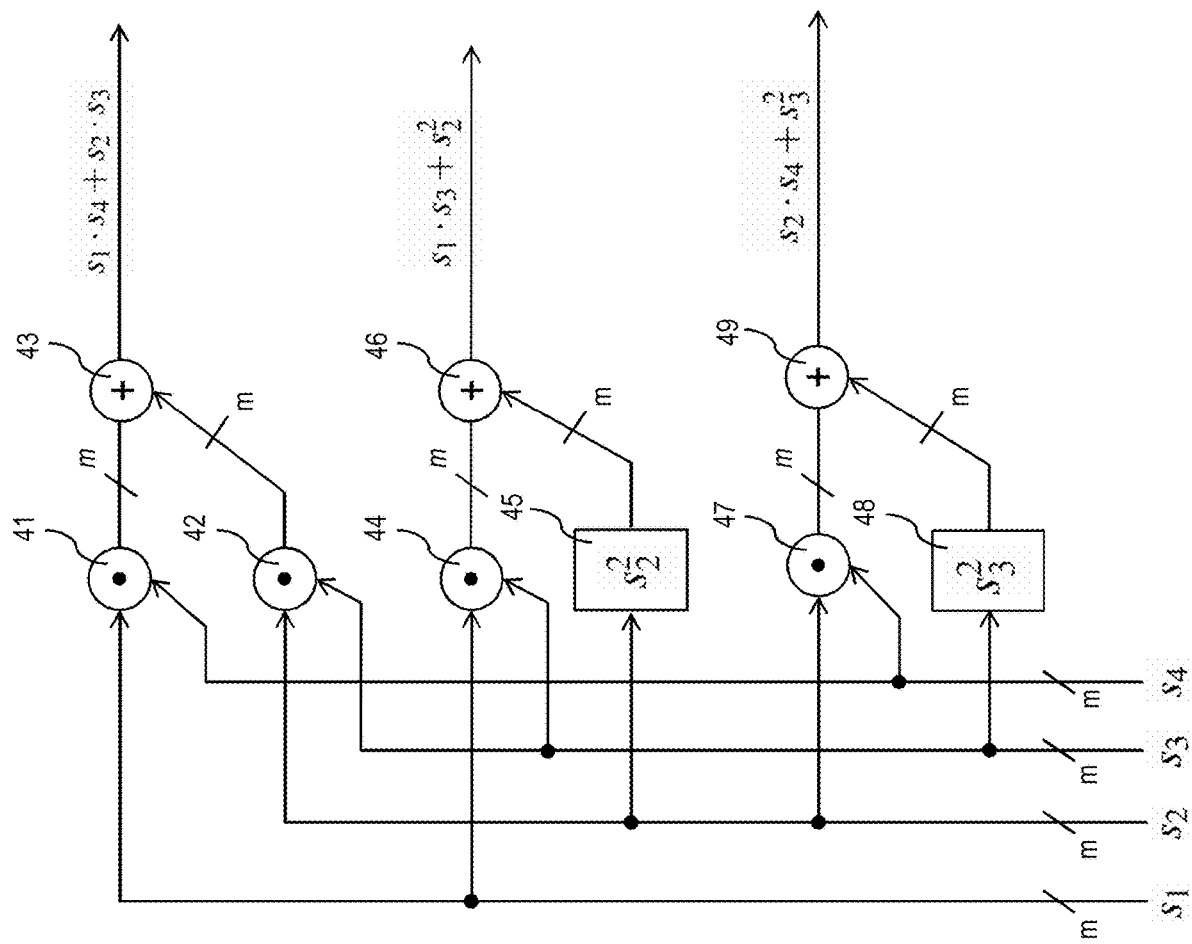
Figure 5:
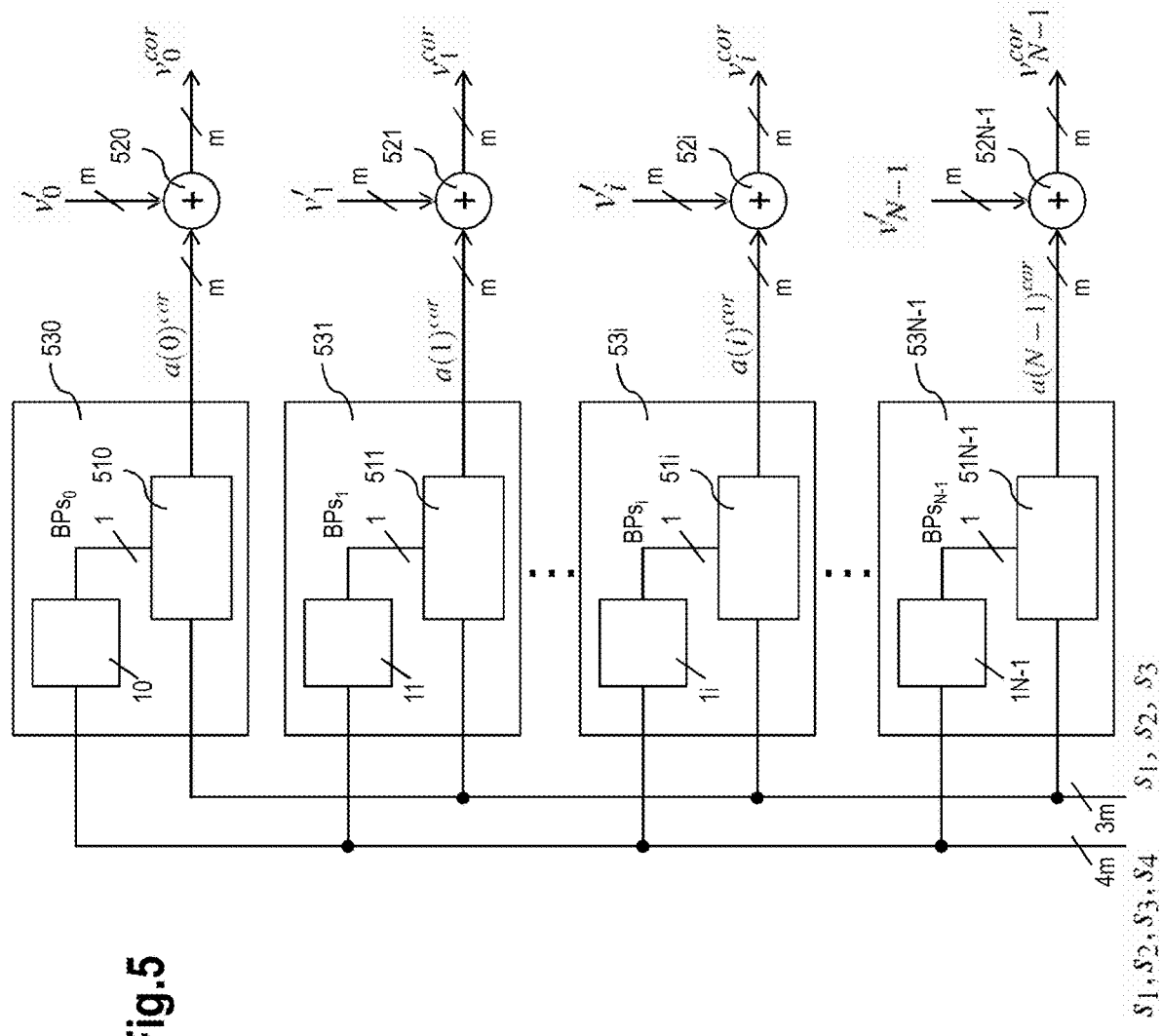
Figure 6:
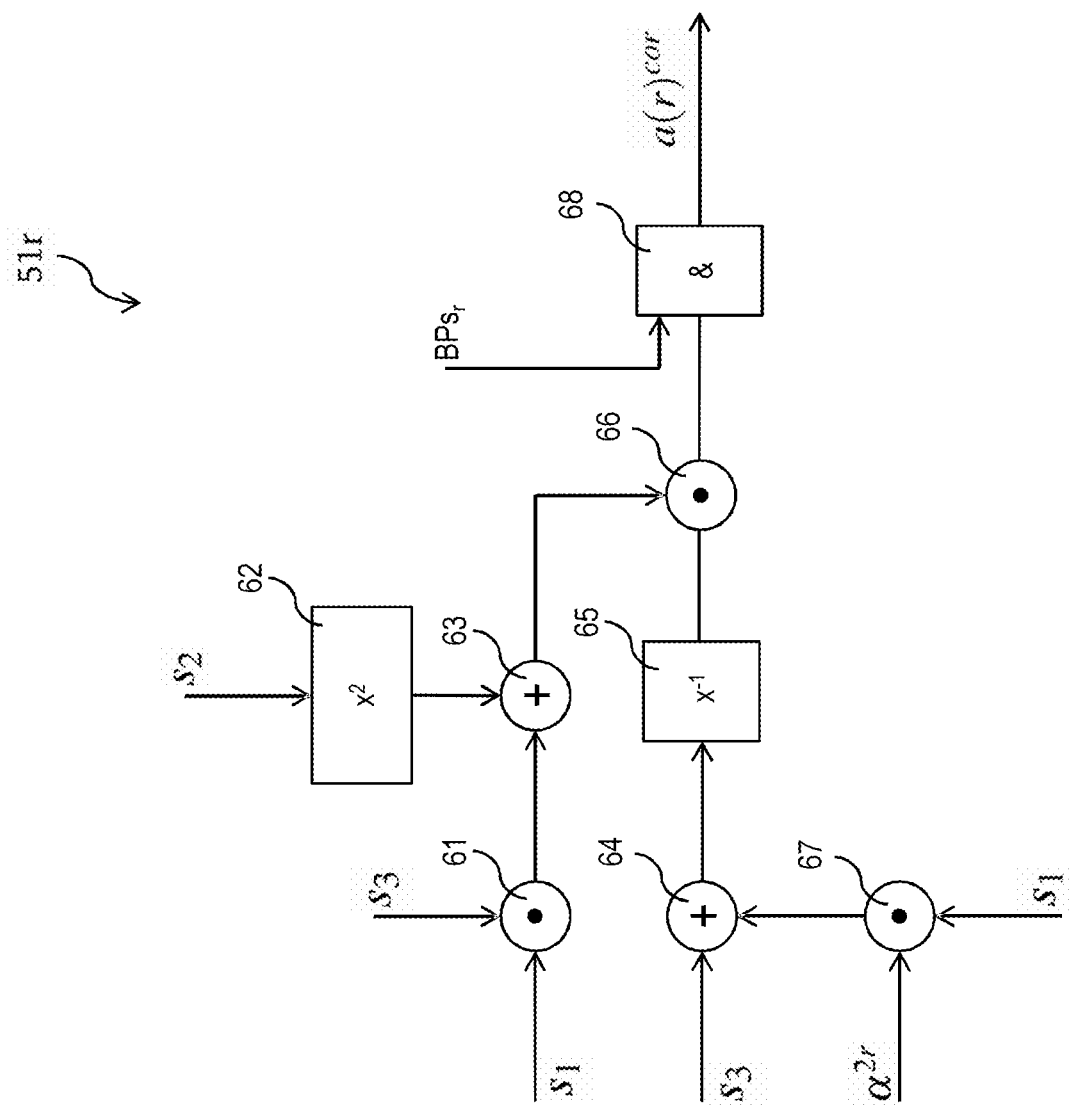
Figure 7:
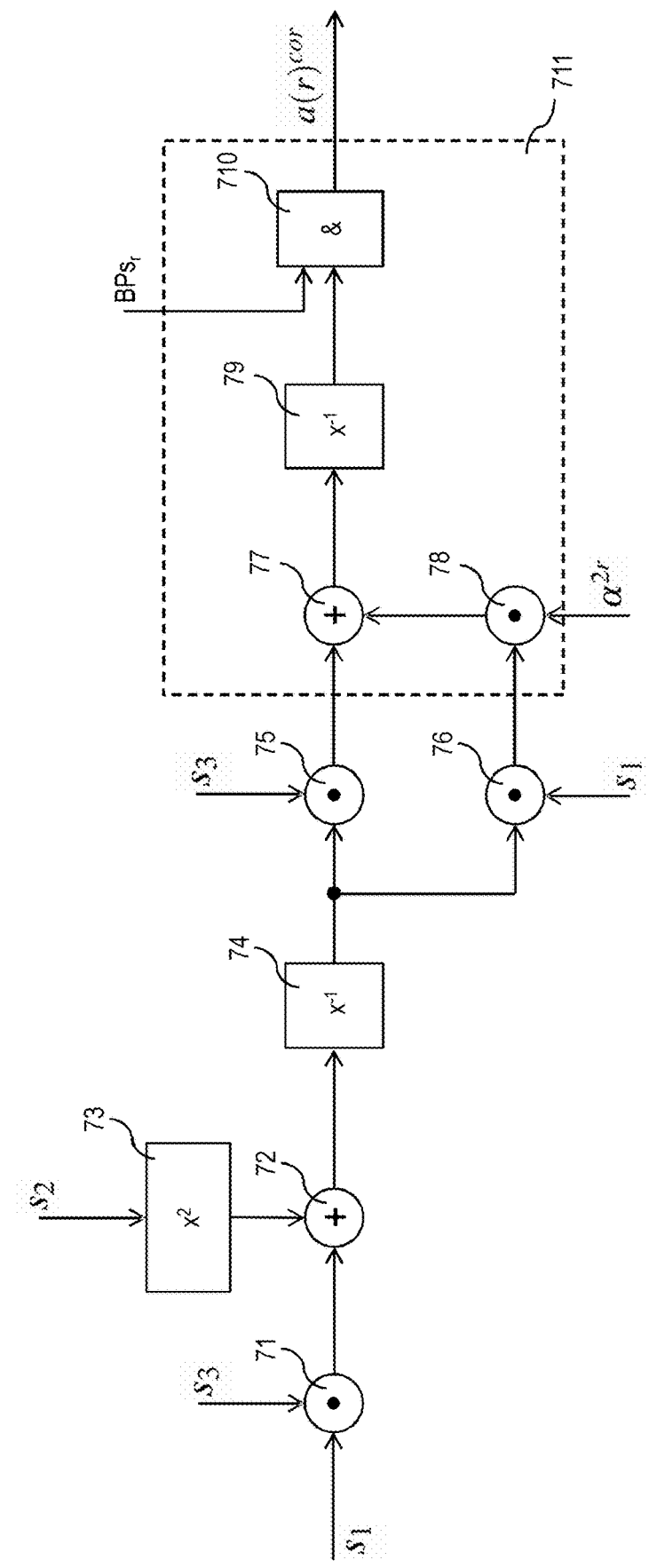
Figure 8:
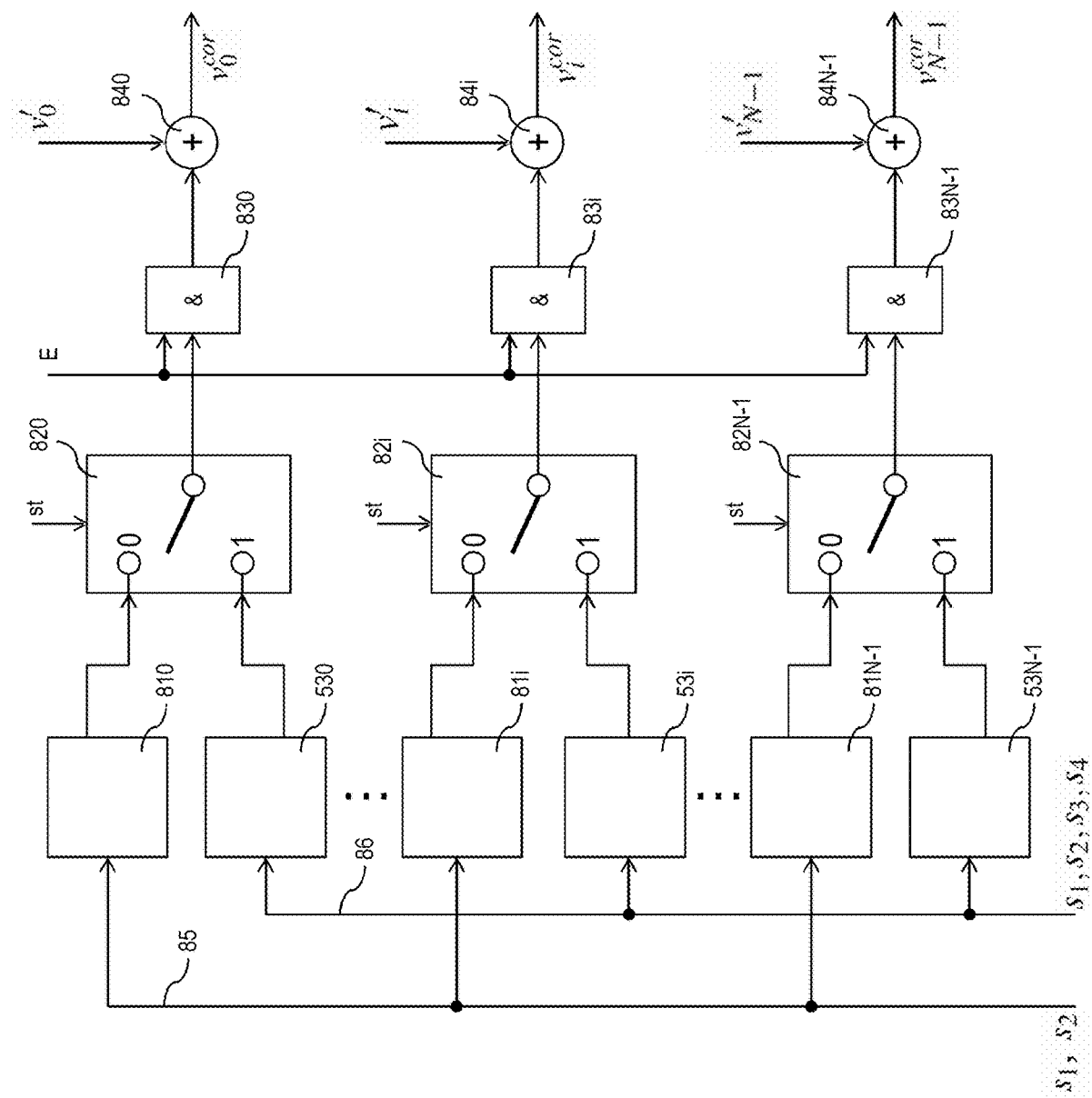
Figure 9:
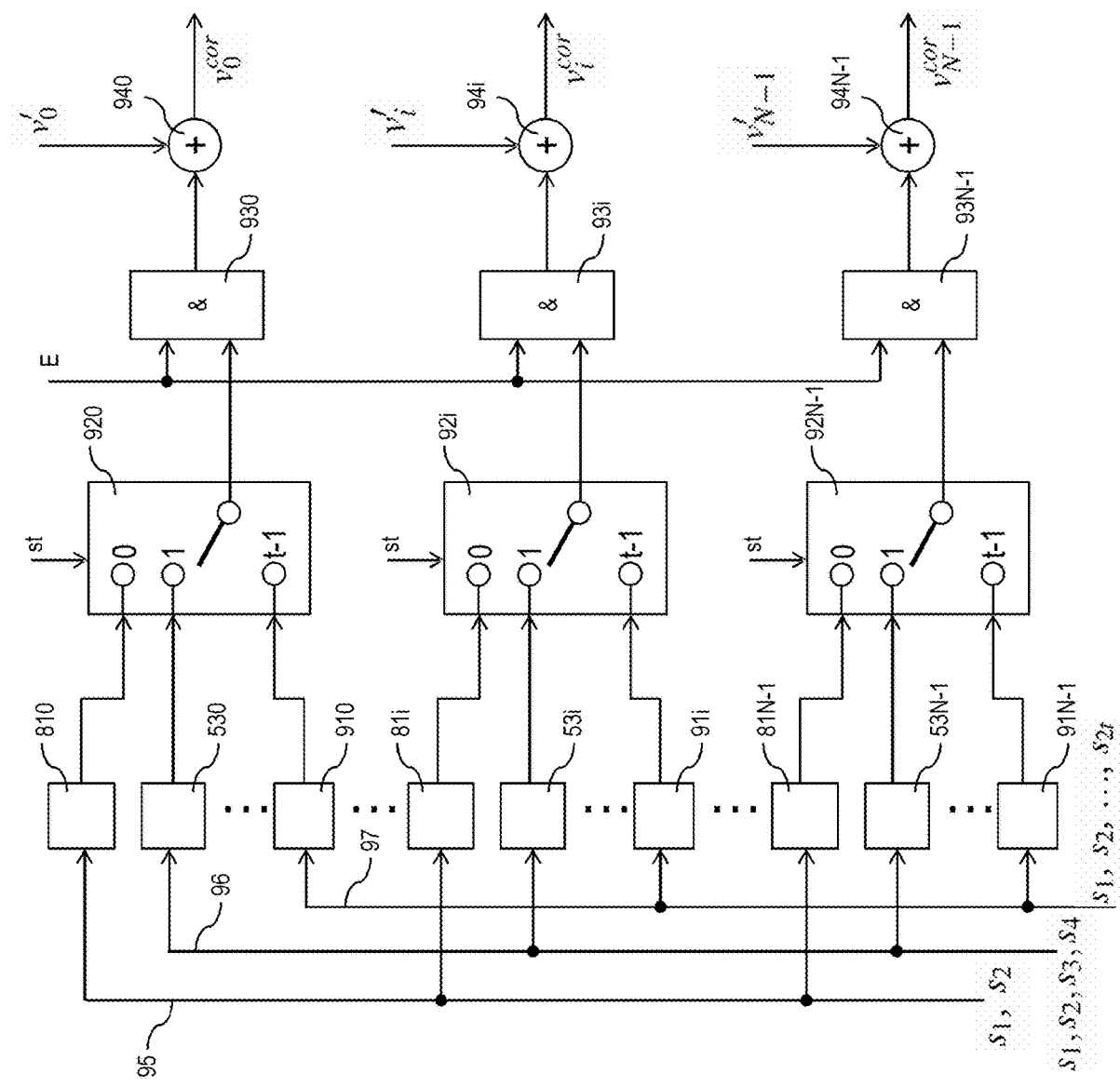
Figure 10:
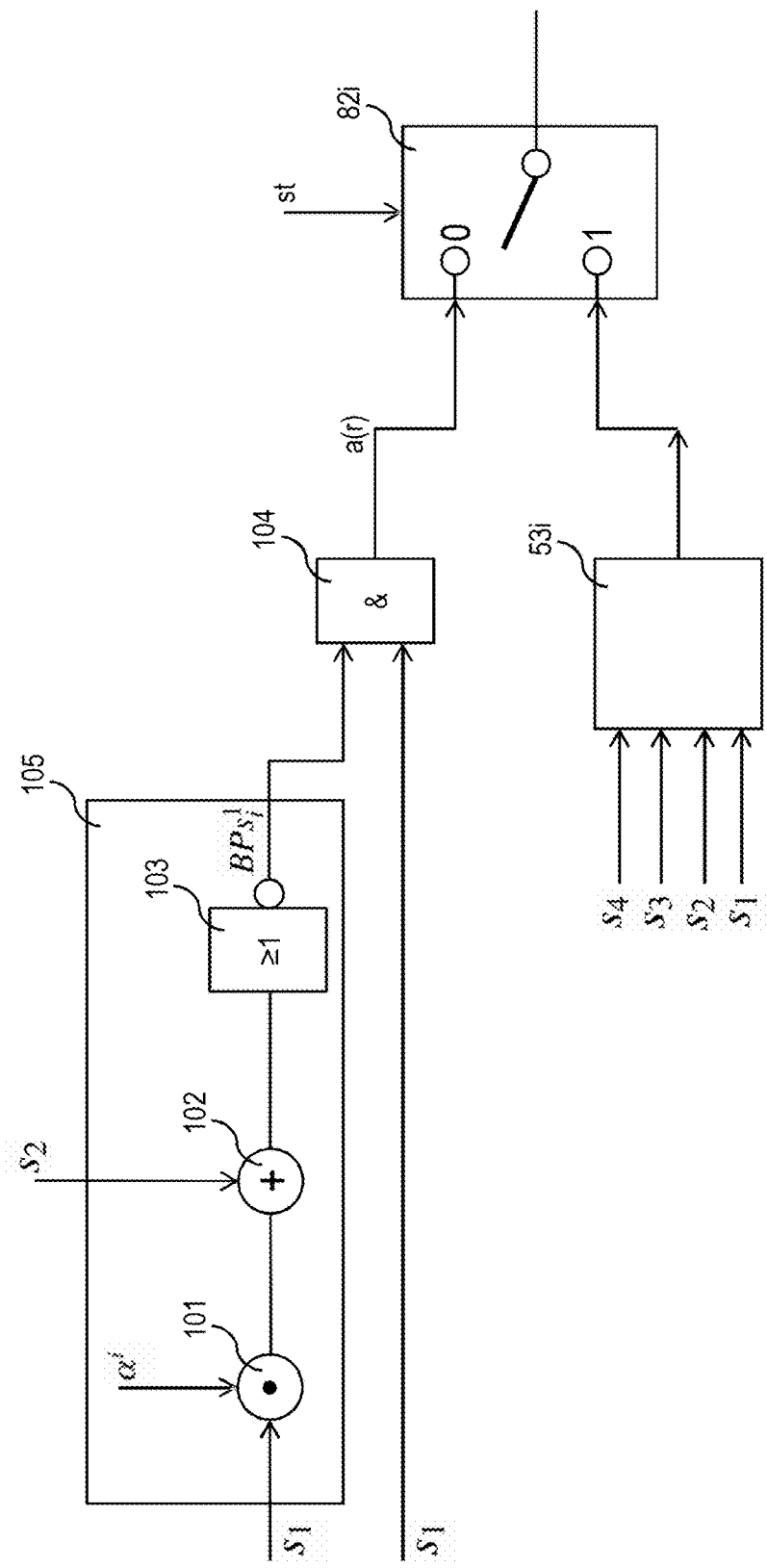
Figure 11:
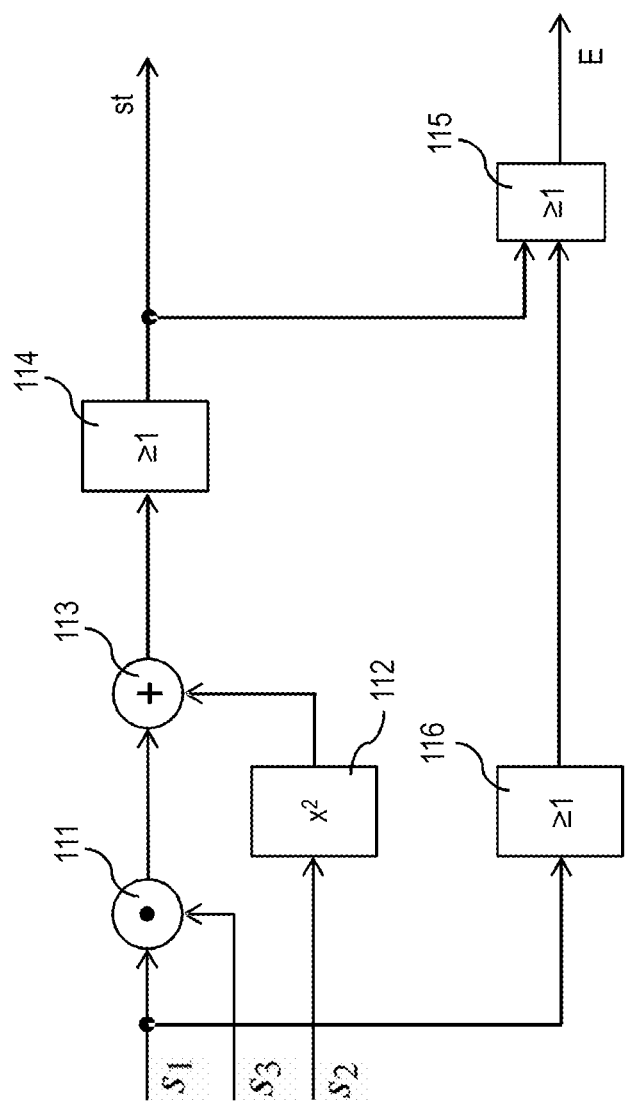
Figure 12:
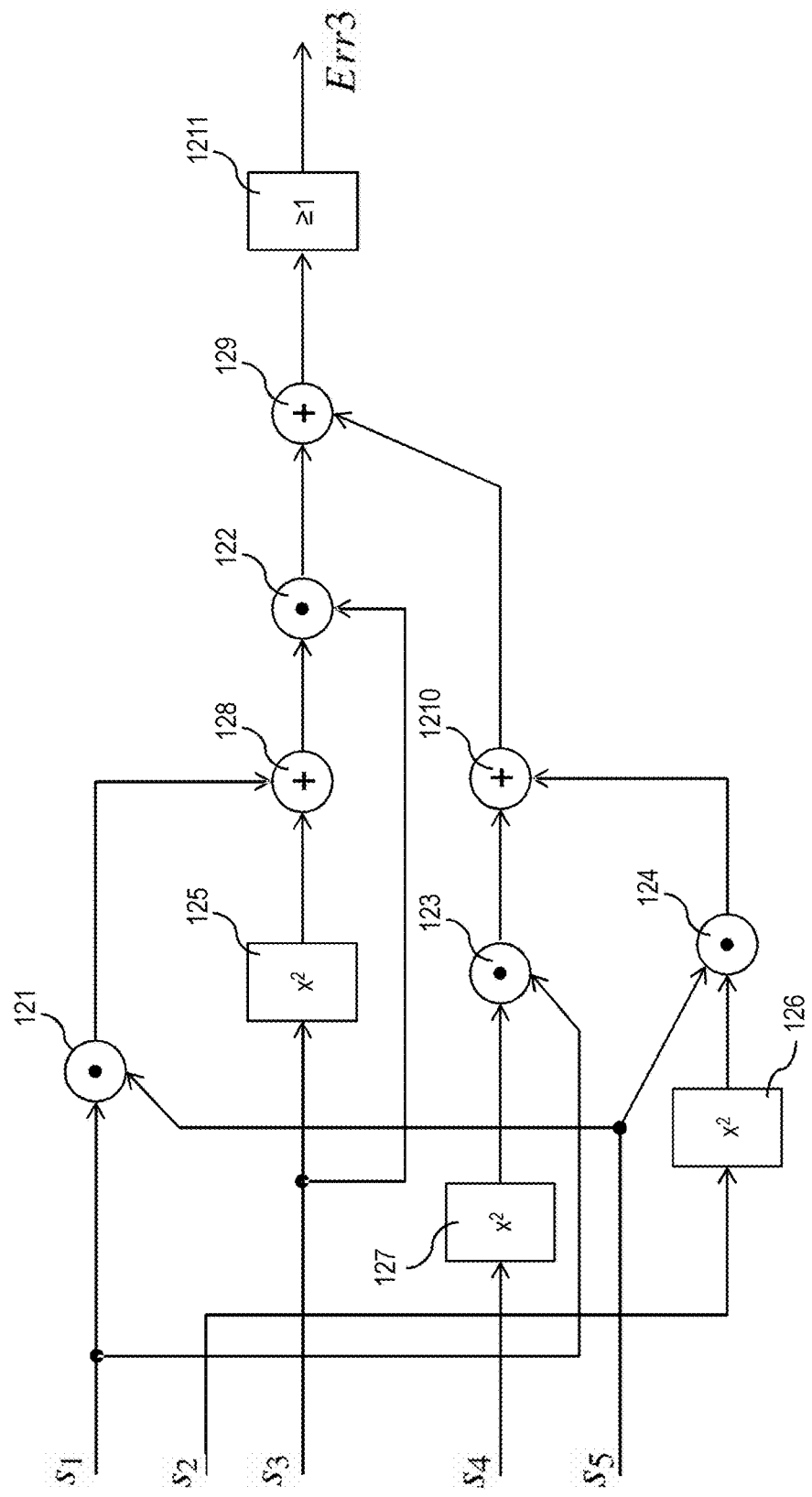

In the figures:

FIG. 1 shows an exemplary circuit arrangement for forming in parallel byte error position signals for 2-byte errors, FIG. 2 shows an alternative configuration of the circuit arrangement shown in FIG. 1, FIG. 3 shows a further configuration of the circuit arrangement shown in FIG. 1 with a central circuit part, FIG. 4 shows an alternative exemplary realization of the central circuit part shown in FIG. 3, FIG. 5 shows one example of a circuit arrangement for byte error correction for 2-byte errors, FIG. 6 shows one example of a realization of the subcircuit shown in FIG. 5 for forming the byte error correction value, FIG. 7 shows a further example of a realization of the subcircuit shown in FIG. 5 for forming the byte error correction value, FIG. 8 shows one example of a correction circuit for 1-byte errors and 2-byte errors using a circuit arrangement for forming byte error position signals for 2-byte errors, FIG. 9 shows an exemplary correction circuit for 1-byte errors, 2-byte errors through to t-byte errors using a circuit arrangement for forming byte error position signals for 2-byte errors, FIG. 10 shows an exemplary configuration of the subcircuit shown in FIG. 8, FIG. 11 shows an error detection circuit, FIG. 12 shows an error detection circuit for detecting 3-byte errors, FIG. 13 shows a table illustrating different forms of representation of elements of a Galois field $GF(2^m)$ where $m=5$.

By way of example, a correction of byte errors using a Reed-Solomon code is discussed below. In this case, a byte can comprise a plurality of bits.

For each correctable byte position a signal (also referred to as a byte error position signal) is determined on the basis of which it is possible to ascertain whether or not the byte is erroneous. By way of example, the byte error position signal has the value 1 if the byte is erroneous, or the value 0 if the byte is not erroneous.

The byte error position signal is preferably determined by a value of a locator polynomial. In the case of byte-error-correcting codes, a dedicated locator polynomial can be used for any number of errors.

Consequently, it is proposed, in particular, to determine a byte error position signal for correctable byte positions of a byte-error-correcting code, wherein the byte-error-correcting code can correct in particular at least two byte errors.

In this case, a correctable byte position is a byte position for which a correction is provided if an error occurs which is correctable by the byte-error-correcting code.

The bytes are for example data bytes, a combination of data bytes and check bytes or a subset thereof. Data bytes preferably contain payload data.

For a byte position it is possible to determine a byte error correction value on the basis of which the byte position is then corrected if an error has occurred there. The byte error position signal indicates whether an error has occurred for a byte and this error can be corrected by means of the byte error correction value. Individual byte positions at which no correction is intended to be carried out can thus be masked out (masked) by means of the byte error position signal.

In particular, in one option, a byte error correction value that is not intended to be used for correction at a byte position (e.g. because this byte position is not erroneous) is multiplied by 0. In this respect, multiplying the byte error correction value by 0 also corresponds to not using the byte error correction value at a byte position.

Reed-Solomon Code, General Description

Some terms and properties of the Reed-Solomon codes are explained below.

By way of example,
t-byte-error-correcting codes and
t-byte-error-correcting and (t+1)-byte-error-detecting codes
are considered. In particular, the cases t=2 and t=1 are taken into account.

By way of example, known Reed-Solomon codes can be used as byte-error-correcting codes. For Reed-Solomon codes reference should be made for example to [Lin, S., Costello, D.: Error Control Coding, Prentice Hall, 1983, pages 170 to 177] or [Wicker, S.: Error Control Systems for Digital Communication and Storage, Prentice Hall, 1995, pages 214 to 224].

A 1-byte-error-correcting and 2-byte-error-detecting Reed-Solomon code has an H matrix $H^*_{Byte}$ as follows:

$$H^*_{Byte} = \begin{pmatrix} \alpha^0 & \alpha^1 & \alpha^2 & \ldots & \alpha^{2^m-2} \\ \alpha^0 & \alpha^2 & \alpha^4 & \ldots & \alpha^{2(2^m-2)} \\ \alpha^0 & \alpha^3 & \alpha^6 & \ldots & \alpha^{3(2^m-2)} \end{pmatrix} \quad (1)$$

In this case, $\alpha^i$ are elements of the Galois field $GF(2^m)$. They are present for example in an exponential representation. $\alpha$ can be a primitive element of the Galois field $GF(2^m)$. The exponents $j$ of $\alpha^j$ should be interpreted modulo $2^m-1$.

It is possible to derive from the H matrix in accordance with equation (1) an H matrix $$H_{Byte} = \begin{pmatrix} \alpha^0 & \alpha^0 & \alpha^0 & \ldots & \alpha^0 \\ \alpha^0 & \alpha^1 & \alpha^2 & \ldots & \alpha^{2^m-2} \\ \alpha^0 & \alpha^2 & \alpha^4 & \ldots & \alpha^{2(2^m-2)} \end{pmatrix} \quad (2)$$

by multiplying, for $i=0, \ldots, (2^m-2)$ the i-th column by $\alpha^{-i}$. This changes only the shape of the H matrix, and not the code, since $\alpha^{-i} \neq 0$. This is also described for example in [Fujiwara, E.: Code Design for Dependable Systems, Wiley, 2006, page 65], wherein the value "1" is used for $\alpha^0$ since $\alpha^0$ is the unity of the Galois field used.

The following H matrix is used for a 2-byte-error-correcting and 3-byte-error-detecting code:

$$H_{Byte} = \begin{pmatrix} \alpha^0 & \alpha^0 & \alpha^0 & \ldots & \alpha^0 \\ \alpha^0 & \alpha^1 & \alpha^2 & \ldots & \alpha^{2^m-2} \\ \alpha^0 & \alpha^2 & \alpha^4 & \ldots & \alpha^{2(2^m-2)} \\ \alpha^0 & \alpha^3 & \alpha^6 & \ldots & \alpha^{3(2^m-2)} \\ \alpha^0 & \alpha^4 & \alpha^8 & \ldots & \alpha^{4(2^m-2)} \end{pmatrix} \quad (3)$$

Each column of the H matrix specified in equation (3) corresponds to one byte.

If the length of the code is equal to N bytes or m N bits (wherein each byte has m bits), only N columns of the H matrices in accordance with equation (1) or equation (3) are used. By way of example, the remaining (last) $2^m-2-N$ columns can then be deleted.

Generally, for a t-byte-error-correcting and t+1-byte-error-detecting code, the H matrix can be specified as follows:

$$H_{Byte} = \begin{pmatrix} \alpha^0 & \alpha^0 & \alpha^0 & \ldots & \alpha^0 \\ \alpha^0 & \alpha^1 & \alpha^2 & \ldots & \alpha^{2^m-2} \\ \alpha^0 & \alpha^2 & \alpha^4 & \ldots & \alpha^{2(2^m-2)} \\ \alpha^0 & \alpha^3 & \alpha^6 & \ldots & \alpha^{3(2^m-2)} \\ \alpha^0 & \alpha^4 & \alpha^8 & \ldots & \alpha^{4(2^m-2)} \\ \vdots & \vdots & \vdots & \ldots & \vdots \\ \alpha^0 & \alpha^{2t-1} & \alpha^{2t-2} & \ldots & \alpha^{2t \cdot (2^m-2)} \end{pmatrix}$$

A code that can correct 2-byte errors and detect 3-byte errors is considered by way of example below.

If an error occurs, a correct vector $v=v^0, \ldots, v^{N-1}$ is disturbed to an erroneous vector $v'=v'^0, \ldots, v'^{N-1}$.

The components $v^0, \ldots, v^{N-1}$ of the vector v are bytes that each comprise m bits, such that $v^i=v_1^i, \ldots, v_m^i$ holds true for $i=0, \ldots, N-1$. The $v_1^i, \ldots, v_m^i$ are thus the m bits of the i-th byte.

An m-bit byte can also be referred to as an element of the Galois field $GF(2^m)$ If a 1-byte error is present, only a single byte is erroneous, that is to say that for a specific $i \in \{0, \ldots, N-1\}$ the associated i-th byte is erroneous.

If the correct i-th byte is designated by $v^i=v_1^i, \ldots, v_m^i$ and the erroneous i-th byte is designated by $v'^i=v'_1^i, \ldots, v'_m^i$, 1 or 2 or up to m bits of the correct i-th byte can differ from the erroneous i-th byte.

A byte error in the i-th byte can be described by
the erroneous byte position i and
a byte error value $$e^i = v^i \oplus v'^i = v_1^i \oplus v'^i_1, \ldots, v_m^i \oplus v'^i_m.$$

In this case, it should be noted that "s" denotes the exclusive-OR operation.

The position of an i-th byte can also be designated by $\alpha^i$.

If the intention is to correct a byte error having the byte error value $e^i$ in the byte position i, then a byte error correction value that is equal to the byte error value is to be determined for the byte position i.

In this example, for a byte error to be corrected, the byte error value is equal to the byte error correction value; in this respect, the terms byte error value and byte error correction value can be used synonymously.

In order to avoid a confusing number of indices, hereinafter byte error values are designated by the alphabetic letters a, b, c.

A byte error correction value for the i-th byte can also be designated by a(i).

Byte positions can be designated by i, j, k, ... or by $\alpha^i$, $\alpha^j$, $\alpha^k$, ..., wherein a is a generating element of the Galois field $GF(2^m)$.

An error syndrome s has syndrome components (also referred to as components, error syndrome components, partial error syndromes or partial syndromes) $s_1$, $s_2$, $s_3$, $s_4$, $s_5$, which are determined for the H matrix in accordance with equation (3) as:

$$s_1 = (\alpha^0, \alpha^0, \ldots, \alpha^0) \cdot (v^{\prime 0}, v^{\prime 1}, \ldots, v^{\prime N-1})^T,$$

$$s_2 = (\alpha^0, \alpha^1, \ldots, \alpha^{N-1}) \cdot (v^{\prime 0}, v^{\prime 1}, \ldots, v^{\prime N-1})^T,$$

$$s_3 = (\alpha^0, \alpha^2, \ldots, \alpha^{2(N-1)}) \cdot (v^{\prime 0}, v^{\prime 1}, \ldots, v^{\prime N-1})^T,$$

$$s_4 = (\alpha^0, \alpha^3, \ldots, \alpha^{3(N-1)}) \cdot (v^{\prime 0}, v^{\prime 1}, \ldots, v^{\prime N-1})^T,$$

$$s_5 = (\alpha^0, \alpha^4, \ldots, \alpha^{4(N-1)}) \cdot (v^{\prime 0}, v^{\prime 1}, \ldots, v^{\prime N-1})^T.$$

In this case, $(v^{\prime 0}, \ldots, v^{\prime N-1})^T$ is a column vector having the components $v^{\prime 0}, \ldots, v^{\prime N-1}$, which can also be referred to as a transpose vector of the row vector $(v^{\prime 0}, \ldots, v^{\prime N-1})$.

The syndrome components $s_1$, $s_2$, $s_3$, $s_4$, $s_5$ respectively form a byte having m bits.

If no error is present, it holds true that:

$$s_1 = s_2 = s_3 = s_4 = s_5 = 0.$$

If a 1-byte error having the byte error value a in the i-th byte error position is present, it holds true that:

$$s_1 = \alpha^0 \cdot a = a$$

$$s_2 = a^i \cdot a$$

$$s_3 = a^{2i} \cdot a$$

$$s_4 = a^{3i} \cdot a$$

$$s_5 = a^{4i} \cdot a. \quad (4)$$

If a 2-byte error having the byte error values a and b in the byte error positions i and j is present, it holds true that:

$$s_1 = \alpha^0 a + \alpha^0 b = a + b$$

$$s_2 = a^i \cdot a + \alpha^j \cdot b$$

$$s_3 = a^{2i} \cdot a + \alpha^{2j} \cdot b$$

$$s_4 = a^{3i} \cdot a + \alpha^{3j} \cdot b$$

$$s_5 = a^{4i} \cdot a + \alpha^{4j} \cdot b. \quad (5)$$

If a 3-byte error having the byte error values a, b and c in the byte error positions i, j and k is present, it holds true that:

$$s_1 = \alpha^0 a + \alpha^0 b + \alpha^0 c = a + b + c$$

$$s_2 = a^i \cdot a + \alpha^j \cdot b + \alpha^k \cdot c$$

$$s_3 = a^{2i} \cdot a + \alpha^{2j} \cdot b + \alpha^{2k} \cdot c$$

$$s_4 = a^{3i} \cdot a + \alpha^{3j} \cdot b + \alpha^{3k} \cdot c$$

$$s_5 = a^{4i} \cdot a + \alpha^{4j} \cdot b + \alpha^{4k} \cdot c. \quad (6)$$

The following relationships are satisfied for the errors considered:

1. For a 1-byte error it holds true that $$s_1 = a \neq 0 \quad (7)$$

and $$s_1 \cdot s_3 + s_2^2 = 0. \quad (8)$$

2. For a 2-byte error it holds true that $$s_1 \cdot s_3 + s_2^2 = a \cdot b \cdot [\alpha^{2i} + \alpha^{2j}] \neq 0. \quad (9)$$

and $$\text{Det}\begin{pmatrix} s_1 & s_2 & s_3 \\ s_2 & s_3 & s_4 \\ s_3 & s_4 & s_5 \end{pmatrix} = s_1 s_3 s_5 + s_3^3 + s_4^2 s_1 + s_2^2 s_5 = 0. \quad (10)$$

3. For a 3-byte error it is the case that $$\text{Det}\begin{pmatrix} s_1 & s_2 & s_3 \\ s_2 & s_3 & s_4 \\ s_3 & s_4 & s_5 \end{pmatrix} = s_1 s_3 s_5 + s_3^3 + s_4^2 s_1 + s_2^2 s_5 == \quad (11)$$

$$a \cdot b \cdot c \cdot \{\alpha^{2i} + \alpha^{2j}\} \cdot \{\alpha^{2j} + \alpha^{2k}\} \cdot \{\alpha^{2j} + \alpha^{2k}\} \neq 0.$$

The byte error positions $\alpha^i$ and $\alpha^j$, in the case of the 2-byte error in the i-th byte and in the j-th byte, can be determined as solution, roots or zeros of the equation $$x^2\{s_1 s_3 + s_2^2\} + x\{s_1 s_4 + s_2 s_3\} + s_2 s_4 + s_3^2 = 0.$$

$$L(x) = x^2\{s_1 s_3 + s_2^2\} + x\{s_1 s_4 + s_2 s_3\} + s_2 s_4 + s_3^2 \quad (12)$$

can also be referred to as a second-degree locator polynomial.

Correspondingly, the byte error positions for the 1-byte error are determined by a zero of a first-degree locator polynomial and, generally, the erroneous byte positions of a τ-byte error for a t-byte-error-correcting code for $$1 \leq \tau \leq t$$

are determined by zeros of a τ-th degree locator polynomial.

If a code word consists of N·m bits and thus of N bytes, then there are only N different byte positions which are taken into consideration as byte error positions. In a corresponding bit-correcting code, by contrast, there are m·N possible erroneous bit positions.

A first-degree locator polynomial is used in the case of a 1-byte error and a second-degree locator polynomial is used in the case of a 2-byte error.

Reed-Solomon Code, Supplementary Explanations

It is possible, in the case of a 2-byte error, to determine a byte error correction value a(i) for an i-th byte depending only on the syndrome components $s_1$, $s_2$, $s_3$ and the byte position i.

In this case, it is advantageous that a plurality of byte error correction values can be determined in parallel for at least three correctable bytes, for example.

By way of example, let it be assumed that a 2-byte error is present. The byte error correction value for each byte position can be determined in parallel on the basis of the syndrome components $s_1$, $s_2$, $s_3$ provided and the known position of each of the correctable bytes. A byte error correction value is determined for the two erroneous bytes and at least for one non-erroneous byte.

A byte error correction value determined for an i-th byte position corresponds to the byte error value at this i-th position.

A byte error position signal likewise determined (if appropriate in parallel) stipulates whether a byte error is present in the byte under consideration and the correction is carried out with the byte error correction value. If the byte error position signal indicates that no byte error is present in the corresponding position, no correction is carried out with the byte error correction value determined for this position.

In other words: the byte error position signal determines the byte positions at which a correction is carried out with the byte error correction value provided: if the byte error position signal indicates a byte error for a byte position, the correction is carried out with the byte error correction value; if the byte error position signal does not indicate a byte error for this byte position, no correction is carried out.

If a t-byte-error-correcting code is considered, the corresponding byte error correction value can be determined for more than t correctable byte positions even before the byte error position signals have been determined for (all or a portion of the) byte positions. A byte error correction value can also be determined in parallel with the byte error position signal.

If no byte error is present in an i-th byte, the byte error correction value determined for this i-th byte is not used for correction on account of the value of the byte error position signal. In this case, it is not necessary for the byte error correction value determined for this non-erroneous byte to be equal to $$0 = \underbrace{0, \ldots, 0}_{m}$$

since the correction is excluded on account of the byte error position signal. Optionally, in this case it is possible to set the byte error correction value for the i-th byte $$0 = \underbrace{0, \ldots, 0}_{m}$$

If a 2-byte error is present, the byte error correction value a(i) of the i-th byte can be determined for a byte error position i such that the following holds true:

$$a(i) = \frac{s_1 s_3 + s_2^2}{s_3 + \alpha^{2i} s_1} \tag{13}$$

If a byte position i at which a byte error has occurred is known for a 2-byte error, on the basis of equation (13) the byte error correction value a(i) for the erroneous byte position i is determined by the syndrome components $s_1$, $s_2$, $s_3$ and the value $\alpha^i$ determined from the byte position i.

For a byte position k, the byte error correction value a(k) where $$a(k) = \frac{s_1 s_3 + s_2^2}{s_3 + \alpha^{2k} s_1} \tag{14}$$

is determined in parallel, for example, independently of whether the byte position k is actually erroneous.

If the byte error position signal indicates that a byte error is present in the byte position k, an error correction of the k-th byte is carried out with the byte error correction value a(k) determined for this byte position k.

If the byte error position signal indicates that no byte error is present in the byte position k, no error correction of the k-th byte is carried out and the byte error correction value a(k) determined for this k-th byte is not used for error correction. Optionally, the byte error correction value can be set to 0.

The byte error correction value for a byte position can thus already be present even before the fact of whether an error has actually occurred at this byte position has been determined.

For different byte positions, the corresponding byte error correction values can be determined in parallel. In particular, the byte error correction values can be determined in parallel for all correctable byte positions or for a subset of the correctable byte positions.

If the byte-error-correcting code can correct up to t erroneous bytes, then more than t byte error correction values can be determined in parallel, for example for all correctable byte positions or else for a subset of at least t+1 correctable byte positions, independently of whether a byte error is present at a byte position.

The value of the byte error position signal determines whether the byte error correction value is used for correcting the corresponding byte.

Correctable byte positions can be for example all data bytes, a subset of the data bytes, check bytes, all bytes of a code word of a t-byte-error-correcting code or a subset of bytes of a code word of the t-byte-error-correcting code.

In this case, the byte error position signal can be determined for example such that for a byte position it assumes a first value if the byte of the byte position is erroneous, and that it assumes a second value, different than the first value, if the byte of the byte position is not erroneous.

The byte error position signal can be determined using the corresponding locator polynomial.

Byte Error Position Signal for the 1-Byte Error

For a 1-byte error, the first-degree locator polynomial is $$s \cdot s_1 = s_2 \tag{15}$$

with the solution or zero $$\alpha^i = \frac{s_2}{s_1}. \tag{16}$$

The byte error correction value a(i) for the erroneous byte position i is $$a(i) = s_1. \tag{17}$$

For every k-th byte, a byte error correction value $$a(k)=s_1=a \qquad (18)$$

is determined.

If an error is present in the i-th byte with the byte error correction value a, such that $s_1=a$, for each byte k a byte error correction value $a(k)=a$ is determined according to equation (18), which byte error correction value is used for the i-th byte that is actually to be corrected, and is masked (e.g. set to zero) for the bytes that are not to be corrected. The decision as to whether or not a byte is corrected is taken on the basis of the value of the corresponding byte error position signal.

For each byte, in the case of a 1-byte error, a byte error position signal is determined using equation (15). The byte error position signal for the byte position i is equal to 1, if $\alpha^i$ is a zero of the locator polynomial in accordance with equation (15) and equal to 0 if $\alpha^i$ is not a zero of the locator polynomial in accordance with equation (15).

A correction of the i-th byte is carried out only if $\alpha^i$ is a zero of the locator polynomial in accordance with equation (15).

Byte Error Position Signal for the 2-Byte Error

The effect of the byte error position signal during the correction of a 2-byte error is illustrated on the basis of an example:

If a t-byte-error-correcting code where $t \geq 2$ is used, then in the case of a 2-byte error the erroneous byte positions are determined by the two zeros of the second-degree locator polynomial in accordance with equation (12).

If the erroneous byte positions are the positions i and j, the byte error position signal is for example equal to 1 if $\alpha^i$ and $\alpha^j$ are in each case a zero of the second-degree locator polynomial in accordance with equation (12), and equal to 0 in all other cases.

For each byte position k it is possible to determine a byte error correction value $$a(k) = \frac{s_1 \cdot s_3 + s_2^2}{s_3 + \alpha^{2k} s_1}$$

These byte error correction values can be determined at least partly in parallel.

The value of the byte error position signal for the byte position k determines whether a correction is carried out at this byte position k. If the byte error position signal is equal to 1, a correction is carried out; if the byte error position signal is equal to 0, no correction is carried out.

For the byte position k=i, the byte error correction value a(i) is determined such that the erroneous i-th byte is corrected by means of the byte error correction value a(i). Likewise, for the byte position k=j, the byte error correction value a(j) is determined such that the erroneous j-th byte is corrected by means of the byte error correction value a(j).

For all other byte positions k where $k \neq i, j$, no byte error is present, and so no correction is required for these byte positions. Even if a byte error correction value a(k) not equal to 0 has been determined, it is not used for correction because the byte error position signal at this byte position assumes the value 0 and thus indicates that no correction is required for this byte position.

Treatment of 1-Byte Errors, 2-Byte Errors and 3-Byte Errors

A description is given below of how byte errors can be detected and differentiated from one another. By way of example, a 2-byte-error-correcting code is considered. A 3-byte error detection is also described supplementarily.

1. The case where only a 1-byte error or a 2-byte error is present is firstly taken as a basis. In such an example, the following holds true for a 2-byte error in accordance with equation (9)

$$s_1 s_3 + s_2^2 \neq 0$$

and for a 1-byte error both of equations (7) and (8) hold true $$s_1 \neq 0$$

$$s_1 s_3 + s_2^2 = 0$$

In addition, it is also necessary to distinguish the case where neither a 1-byte error nor a 2-byte error has occurred. The conclusion that neither a 1-byte error nor a 2-byte error has occurred can already be drawn from $s_1=0$.

If the probability for a 3-byte error is extremely low, the conclusion that no error has occurred can be drawn for this case.

2. The case where only a 1-byte error or only a 2-byte error or only a 3-byte error is present is now considered. For a 3-byte error the following holds true in accordance with equation (11)

$$s_1 s_3 s_5 + s_3^3 + s_4^2 s_1 + s_2^2 s_5 \neq 0.$$

The following correspondingly holds true for a 2-byte error or for a 1-byte error:

$$s_1 s_3 s_5 + s_3^3 + s_4^2 s_1 + s_2^2 s_5 = 0. \qquad (19)$$

If a 2-byte error is present, equation (9) additionally holds true $$s_1 s_3 + s_2^2 \neq 0.$$

For a 1-byte error, equations (7) and (8) once again hold true $$s_1 \neq 0.$$

$$s_1 s_3 + s_2^2 = 0.$$

From the condition in accordance with equation (9) alone it is not possible to deduce that a 2-byte error is present, since this condition also holds true for the 3-byte error.

The correction of 2-byte errors can be carried out as follows: for each byte position i where $i \in \{0.1, \ldots, N-1\}$, a value $L(a^i)$ of the second-degree locator polynomial is determined in accordance with $$L(\alpha^i)=\alpha^{2i}\{s_1 s_3+s_2^2\}+\alpha^i\{s_1 s_4+s_2 s_3\}+s_2 s_4+s_3^2. \qquad (20)$$

If $L(a^1)=0$, the i-th byte is corrected. If $L(a^1) \neq 0$, then the i-th byte is not corrected. A byte error position signal $BPs_i$ can specify whether or not a correction of the respective byte is carried out. The byte error position signal $BPs_i$ is determined for example by $$BP_{S_i} = \begin{cases} 1 & \text{if } L(\alpha^i) = 0, \\ 0 & \text{if } L(\alpha^i) \neq 0. \end{cases} \qquad (21)$$

In the case of circuit arrangements which realize operations in a Galois field $GF(2^m)$, use is made of, for example, multipliers, constant multipliers, squarers, (third) power forming units or the like. The circuitry implementation of individual operations of this type is known. An illustration is given below by way of example of how multipliers, squarers, third power forming units and constant multipliers can be realized in a Galois field determined for example by its modular polynomial. By way of example, m=5 is assumed, such that a byte consists of m=5 bits and the corresponding Galois field is $GF(2^5)$.

Example in the Galois Field $GF(2^m)$ where m=5 m=5 is chosen by way of example, such that the underlying Galois field $$GF(2^m)=GF(2^5)=GF(32)$$

comprises a total of 32 elements.

Elements of the Galois field GF(32) are presented in their various forms of representation in FIG. 13. The modular polynomial of the Galois field GF(32) is the polynomial $$p(x)=1+x^2 x^5.$$

The first column of the table shown in FIG. 13 comprises the elements $\alpha^i \neq 0$ of the $GF(2^5)$ for i=0, 1, ..., 30 in exponent representation (also referred to as exponential representation). The zero element of the field has no exponent representation. The second column of the table lists all elements in their polynomial representation for the associated modular polynomial p(x). The third column of the table shows the tuple or vector representation of the elements of the $GF(2^5)$. The vector representation of an element can be read directly from the polynomial representation. In this case, the five components of the vector representation correspond, from left to right, to the coefficients of the associated powers in the polynomial representation.

$$x^0, x^1, x^2, x^3, x^4$$

The corresponding polynomial representation results from the power representation $\alpha^i$ by determining $[x^i$ modulo $(1+x^2+x^5)]$. By way of example, the polynomial representation of $\alpha^5$ is equal to $1+x^2$ since $$x^5 \text{ modulo } (1+x^2+x^5)=1+x^2$$

holds true.

The multiplication of two elements of the Galois field can be performed in the exponent representation or in the polynomial representation. If two elements of the Galois field $GF(2^m)=GF(2^5)$ are given in the exponent representation $\alpha^i$ and $\alpha^j$, their product results as:

$$\alpha^i \cdot \alpha^j = \alpha^k \text{ where } k=(i+j) \text{ modulo } (2^m-1)=(i+j) \text{ modulo } 31.$$

If the elements to be multiplied in the Galois field are present in their vector representation or in the polynomial representation, their multiplication can be performed by a Galois field multiplier. The multiplication of two elements in their polynomial representation is described by way of example below. In order to multiply together two elements given as elements of the Galois field $GF(2^m)=GF(2^m)$ in their polynomial representation, the polynomials should be multiplied together directly in the customary manner, and the result should be determined modulo the modular polynomial.

If the polynomials $1+x^2+x^3$ and $x+x^3$ are given, for example, then their direct multiplication yields $$(1+x^2+x^3)(x+x^3)=x+x^4+x^5+x^6.$$

Owing to $$x^5=1+x^2 \text{ modulo } (1+x^2+x^5) \text{ and}$$

$$x^6=x+x^3 \text{ modulo } (1+x^2+x^5)$$

it follows that $$x+x^4+x^5+x^6=x+x^4+1+x^2+x+x^3=1+x^2+x^3+x^4.$$

The following thus holds true as a result:

$$(1+x^2+x^5) \cdot (x+x^3)=1+x^2+x^3+x^4.$$

A description is given below of the case according to which a first element a(x) where $$a(x)=a_4 x^4+a_3 x^3+a_2 x^2+a_1 x+a_0$$

and a second element b(x) where $$b(x)=b_4 x^4+b_3 x^3+b_2 x^2+b_1 x+b_0$$

in the Galois field $GF(2^5)$ are multiplied by the modular polynomial $$m(x)=x^5+x^2+1.$$

Directly multiplying out the polynomials a(x) and b(x) yields firstly an 8-th degree polynomial. With $$x^5 \text{ modulo } (1+x^2+x^5)=1+x^2,$$

$$x^6 \text{ modulo } (1+x^2+x^5)=x+x^3,$$

$$x^7 \text{ modulo } (1+x^2+x^5)=x^2+x^2,$$

$$x^8 \text{ modulo } (1+x^2+x^5)=1+x^2+x^3,$$

a fourth-degree polynomial arises as follows:

$$c_4 x^4 + c_3 x^3 + c_2 x^2 + c_1 x^1 + c_0 = a(x) \cdot b(x) \bmod m(x) = = (a_0 b_4 + a_1 b_3 + a_2 b_2 + a_3 b_1 + a_3 b_4 + a_4 b_0 + a_2 b_3) \cdot x^4 + + (a_0 b_3 + a_1 b_2 + a_2 b_1 + a_2 b_4 + a_3 b_0 + a_3 b_3 + a_4 b_2 + a_4 b_4) \cdot x^3 + + (a_0 b_2 + a_1 b_1 + a_1 b_4 + a_2 b_0 + a_2 b_3 + a_3 b_2 + a_3 b_4 + a_4 b_1 + a_4 b_3 + a_4 b_4) \cdot x^2 + + (a_0 b_1 + a_1 b_0 + a_2 b_4 + a_3 b_3 + a_4 b_2) \cdot x^1 + + (a_0 b_0 + a_1 b_4 + a_2 b_3 + a_3 b_2 + a_3 b_1 + a_4 b_4).$$

This relationship is realized by a Galois field multiplier having five first binary inputs, five second binary inputs and five binary outputs. This is explained in greater detail below.

The binary values $a_0, a_1, a_2, a_3, a_4$ are present at the first five inputs of the Galois field multiplier and the binary values $b_0, b_1, b_2, b_3, b_4$ are present at the second five inputs, while the values $c_0, c_1, c_2, c_3, c_4$ where $$(a_0 b_0+a_1 b_4+a_2 b_3+a_3 b_2+a_3 b_1+a_4 b_4)=c_0, \quad (22)$$

$$(a_0 b_1+a_1 b_0+a_2 b_4+a_3 b_3+a_4 b_2)=c_1 \quad (23)$$

$$(a_0 b_2+a_1 b_1+a_1 b_4+a_2 b_0+a_2 b_3+a_3 b_2+a_3 b_4+a_4 b_1+a_4 b_3+a_4 b_4)=c_2 \quad (24)$$

$$(a_0 b_3+a_1 b_2+a_2 b_1+a_2 b_4+a_3 b_0+a_3 b_3+a_4 b_2+a_4 b_4) \cdot c_3 \quad (25)$$

$$(a_0 b_4+a_1 b_3+a_2 b_2+a_3 b_1+a_3 b_4+a_4 b_0+a_2 b_3) \cdot c_4 \quad (26)$$

are output at the five binary outputs. In this case, the symbol "+" denotes addition modulo 2 (XOR operation)

The implementation of equations (22) to (26) can be carried out by means of a Galois field multiplier, for example using AND gates and XOR gates (exclusive-OR gates). By way of example, a synthesis tool can also be used in the context of the implementation.

If an element of the Galois field is squared, it is to be multiplied by itself. If, in the polynomial representation, an element is given as a polynomial $$a(x)=a_0+a_1 x^1+a_2 x^2+a_3 x^3+a_4 x^4$$

it holds true that $$(a(x))^2 \bmod m(x) == [a_0 + a_1 x^2 + a_2 x^4 + a_3 x^6 + a_4 x^8] \bmod$$
$$(1 + x^2 + x^5) == (a_2)x^4 + (a_3 + a_4)x^3 + (a_1 + a_4)x^2 + a_3 x^1 + (a_0 + a_4).$$

Squaring an element in the Galois field $GF(2^5)$ can correspondingly be realized by a squarer having five binary inputs and five binary outputs. The binary values $a_0, a_1, a_2, a_3, a_4$ are fed in at its five binary inputs and the binary values $d_0, d_1, d_2, d_3, d_4$ are provided at the five binary outputs. It holds true that $$a_0 + a_4 = d_0, \quad (27)$$

$$a_3 = d_1, \quad (28)$$

$$a_1 + a_4 = d_2, \quad (29)$$

$$a_3 + a_4 = d_3, \quad (30)$$

$$a_2 = d_4, \quad (31)$$

wherein the symbol "+" once again denotes addition modulo 2 (XOR operation).

In order to realize a squarer in the Galois field $GF(2^5)$ with the modular polynomial $m(x) = 1 + x^2 + x^5$, equations (27) to (31) can be implemented by means of XOR gates, for example.

On the basis of the example of the Galois field $GF(2^5)$ a description is given of how the third power of an element which is specified in its polynomial representation can be determined.

If the third power $(a(x))^3$ of a polynomial $$a(x) = a_0 + a_1 x^1 + a_2 x^2 + a_3 x^3 + a_4 x^4$$

is determined modulo the modular polynomial $m(x) = 1 + x^2 + x^5$, it holds true that:

$$(a(x))^3 \bmod m(x) == (a_0 a_2 + a_0 a_4 + a_1 a_2 + a_1 a_3 + a_1 a_4 +$$
$$a_2 a_3 + a_2 a_4 + a_3 a_4) \cdot x^4 + + (a_0 a_4 + a_1 + a_2 + a_2 a_3 +$$
$$a_2 a_4 + a_3 + a_4) \cdot x^3 + + (a_0 a_1 + a_0 a_2 + a_0 a_4 + a_1 a_2 + a_2 a_4 +$$
$$a_3 a_4 + a_4) \cdot x^2 + + (a_0 a_1 + a_0 a_3 + a_2 + a_3 + a_3 a_4 + a_4) \cdot x^1 + +$$
$$(a_0 + a_0 a_4 + a_1 a_2 + a_1 a_3 + a_2 a_3))$$

Forming the third power of an element in the Galois field $GF(2^5)$ can correspondingly be realized by a third power forming unit having five binary inputs and five binary outputs. The binary values $a_0, a_1, a_2, a_3, a_4$ are fed to the five binary inputs and the binary values $f_0, f_1, f_2, f_3, f_4$ are provided at the five binary outputs. It holds true that:

$$f_0 = a_0 + a_0 a_4 + a_1 a_2 + a_1 a_3 + a_2 a_3 \quad (32)$$

$$f_1 = a_0 a_1 + a_0 a_3 + a_2 + a_3 + a_3 a_4 + a_4 \quad (33)$$

$$f_2 = a_0 a_1 + a_0 a_2 + a_0 a_4 + a_1 a_2 + a_2 a_4 + a_3 a_4 + a_4 \quad (34)$$

$$f_3 = a_0 a_4 + a_1 + a_2 + a_2 a_3 + a_2 a_4 + a_3 + a_4 \quad (35)$$

$$f_4 = a_0 a_2 + a_0 a_4 + a_1 a_2 + a_3 a_3 + a_3 a_4 + a_2 a_3 + a_2 a_4 + a_3 + a_3 a_4 \quad (36)$$

By way of example, a third power forming unit can be realized, in the present example in the Galois field $GF(2^5)$ with the modular polynomial $m(x) = 1 + x^2 + x^5$, by merely implementing equations (32) to (36).

Alternatively, a third power forming unit can be realized from a squarer and a Galois field multiplier connected downstream. Moreover, higher powers of the element $a(x)$ can be realized in a corresponding manner using suitable components.

An implementation of a constant multiplier in the Galois field $GF(2^m)$ is illustrated below by way of example for m=5. The modular polynomial is $$m(x) = 1 + x^2 + x^5.$$

Let $a \in GF(2^5)$ be an arbitrary element of the Galois field with the following polynomial representation $$a(x) = a_0 + a_1 x + a_2 x^2 + a_3 x^3 + a_4 x^4. \quad (37)$$

As a constant to be multiplied, $\alpha^9$ is chosen by way of example, the polynomial representation of which is given in accordance with the table shown in FIG. 13 by $$\alpha^9(x) = x + x^3 + x^4 \quad (38)$$

As multiplication the following arises $$a(x) \cdot \alpha^9(x) \bmod (1 + x^2 + x^5) = b_0 + b_1 x + b_2 x^2 + b_3 x^3 + b_4 x^4 \quad (39)$$

where $$b_0 = a_1 + a_2, \quad (40)$$

$$b_1 = a_0 + a_2 + a_3, \quad (41)$$

$$b_2 = a_2 + a_3 + a_4, \quad (42)$$

$$b_3 = a_0 + a_3 + a_4, \quad (43)$$

$$b_4 = a_0 + a_1 + a_4, \quad (44)$$

The output values $b_0, \ldots, b_4$ are derived from the input values $a_0, \ldots, a_4$ in accordance with the relationships represented in equations (40) to (44), such that the output values are determined from the input values by XOR operations. In this case, the symbol "+" denotes addition modulo 2 (XOR operation). Accordingly, the constant multiplier can be realized by means of XOR gates.

Description of a Byte Error Position Signal Forming Unit for Forming Byte Error Position Signals FIG. 1 shows an exemplary circuit arrangement for determining byte error position signals. A 2-byte-error-correcting error code having code words composed of n bytes is considered by way of example, wherein each byte has in each case m bits.

The circuit arrangement has N byte error position signal forming units $10, 11, \ldots, 1i, \ldots, 1N-1$, which provide byte error position signals $BPs_0, BPs_1, \ldots, BPs_i, \ldots, BPs_{N-1}$ via their respective 1-bit-wide output.

At respective 4·m-bit-wide inputs of the N byte error position signal forming units $10, 11, \ldots, 1i, \ldots, 1N-1$, a 4·m bit-wide error syndrome $$s = s_1, s_2, s_3, s_4$$

provided by a syndrome generator (not illustrated in FIG. 1) is present, which consists of the respective m-bit-wide syndrome components $s_1, s_2, s_3, s_4$.

If all bytes are corrected in the case of an error, then N=n holds true. If fewer than n bytes are corrected in the case of an error, N<n holds true. By way of example, it is possible that only data bytes are corrected in the case of an error. Check bytes could not then be corrected in such an example.

The byte error position signal forming unit 10 is configured for example such that it outputs the byte error position signal $BPs_0 = 1$ if the following holds true:

$$\alpha^{2 \cdot 0}\{s_1 s_3 + s_2^2\} \alpha^0 \{s_1 s_4 + s_2 s_3\} + s_2 s_4 + s_3^2 = 0$$

that it outputs the byte error position signal $BPs_0 = 0$ if the following holds true:

$$\alpha^{2 \cdot 0}\{s_1 s_3 + s_2^2\} \alpha^0 \{s_1 s_4 + s_2 s_3\} + s_2 s_4 + s_3^2 \neq 0$$

The byte error position signal forming unit 11 is configured for example such
that it outputs the byte error position signal $BPs_1=1$ if the following holds true:

$$\alpha^{2 \cdot 1}\{s_1 s_3 + s_2^2\} \alpha^1 \{s_1 s_4 + s_2 s_3\} + s_2 s_4 + s_3^2 = 0$$

that it outputs the byte error position signal $BPs_i=0$ if the following holds true:

$$\alpha^{2 \cdot 1}\{s_1 s_3 + s_2^2\} \alpha^1 \{s_1 s_4 + s_2 s_3\} + s_2 s_4 + s_3^2 \neq 0$$

The byte error position signal forming unit 1i is configured for example such
that it outputs the byte error position signal $BPs_i=1$ if the following holds true:

$$\alpha^{2 \cdot i}\{s_1 s_3 + s_2^2\} \alpha^i \{s_1 s_4 + s_2 s_3\} + s_2 s_4 + s_3^2 = 0$$

that it outputs the byte error position signal $BPs_i=0$ if the following holds true:

$$\alpha^{2 \cdot i}\{s_1 s_3 + s_2^2\} \alpha^i \{s_1 s_4 + s_2 s_3\} + s_2 s_4 + s_3^2 \neq 0$$

The byte error position signal forming unit 1N−1 is configured for example such
that it outputs the byte error position signal $BPs_{N1}=1$ if the following holds true:

$$\alpha^{2 \cdot (N-1)}\{s_1 s_3 + s_2^2\} \alpha^{N-1} \{s_1 s_4 + s_2 s_3\} + s_2 s_4 + s_3^2 = 0$$

that it outputs the byte error position signal $BPs_{N-1}=0$ if the following holds:

$$\alpha^{2 \cdot (N-1)}\{s_1 s_3 + s_2^2\} \alpha^{N-1} \{s_1 s_4 + s_2 s_3\} + s_2 s_4 + s_3^2 \neq 0$$

In this case, the respective exponents of a are to be interpreted modulo $2^m - 1$.

If a 2-byte error is present and if the j-th byte and the k-th byte are erroneous, then for i=j and for i=k the byte error position signals $BPs_i$ are equal to 1, while all other byte error position signals $BPs_l$ where $l \neq j, k$ are equal to 0, wherein it holds true that:

$$0 \leq i, j, k, l \leq N-1,$$

i. $\alpha^0 = 1$ and
is the unity of the Galois field $GF(2^m)$

Byte Error Position Signal Forming Unit in Accordance with FIG. 2

FIG. 2 shows a circuit arrangement which represents one possible configuration of the circuit arrangement shown in FIG. 1.

The byte error position signal forming unit 10 shown in FIG. 1 comprises
a subcircuit 210 having a 4·m-bit-wide input for inputting the components $s_1$, $s_2$, $s_3$ and $s_4$ of the error syndrome $s=s_1$, $s_2$, $s_3$, $s_4$ and three respective m-bit-wide outputs,
a constant multiplier 220 having a first m-bit-wide input, a second m-bit-wide input and an m-bit-wide output,
a constant multiplier 230 having a first m-bit-wide input, a second m-bit-wide input and an m-bit-wide output,
an XOR circuit 240 having three respective m-bit-wide inputs and an m-bit-wide output, and
a NOR circuit 250 (NOT-OR circuit) having an m-bit-wide input and a 1-bit-wide binary output.

The subcircuit 210 is configured in such a way that upon the error syndrome s being input, it
outputs $s_1 \cdot s_4 + s_2 \cdot s_3$ at the first output,
outputs $s_1 \cdot s_3 + s2/2$ at the second output and
outputs $s_2 \cdot s_4 + s2/3$ at the third output.

The first output of the subcircuit 210 is connected to the first input of the constant multiplier 220. The constant $\alpha^0 = 1$ is present at the second input of the constant multiplier 220, such that $$\alpha^0 (s_1 \cdot s_4 + s_2 \cdot s_3) = s_1 \cdot s_4 + s_2 \cdot s_3$$

is provided at the output of the constant multiplier 220.

The output of the constant multiplier 220 is connected to the first input of the XOR circuit 240.

The second output of the subcircuit 210 is connected to the first input of the constant multiplier 230. The constant $\alpha^{2.0} = \alpha^0$ is present at the second input of the constant multiplier 230, such that $$\alpha^0 (s_1 \cdot s_3 + s_2^2) = s_1 \cdot s_3 + s_2^2$$

is provided at the output of the constant multiplier 230.

The output of the constant multiplier 230 is connected to the second input of the XOR circuit 240.

The third output of the subcircuit 210 is connected to the third input of the XOR circuit 240.

The XOR circuit 240 forms for example a component-by-component XORing of the respective m-bit-wide values present at its three inputs and provides the value $$x^0 = \alpha^0 (s_1 \cdot s_4 + s_2 \cdot s_3) = \alpha^0 (s_1 \cdot s_3 + s_2^2) + s_2 \cdot s_4 + s_3^2$$

at its m-bit-wide output, this value being passed to the input of the NOR circuit 250. The NOR circuit 250 provides at its output
the binary value $BPs_0 = 1$ if $v^0 = 0$ holds true and
the binary value $BPs_0 = 0$ if $v^0 = 0$ holds true.

The byte error position signal forming unit 11 shown in FIG. 1 comprises
a subcircuit 211 having a 4·m-bit-wide input for inputting the components $s_1$, $s_2$, $s_3$, $s_4$ of the error syndrome $s=s_1$, $s_2$, $s_3$, $s_4$ and three respective m-bit-wide outputs,
a constant multiplier 221 having a first m-bit-wide input, a second m-bit-wide input and an m-bit-wide output,
a constant multiplier 231 having a first m-bit-wide input, a second m-bit-wide input and an m-bit-wide input,
an XOR circuit 241 having three respective m-bit-wide inputs and an m-bit-wide output, and
a NOR circuit 251 having an m-bit-wide input and a 1-bit-wide binary output.

The subcircuit 211 is configured in such a way that, upon the error syndrome s being input, it
outputs $s_1 \cdot s_4 + s_2 \cdot s_3$ at the first output,
outputs $s_1 \cdot s_3 + s_2^2$ at the second output and
outputs $s_2 \cdot s_4 + s_3^2$ at the third output.

The first output of the subcircuit 211 is connected to the first input of the constant multiplier 221. The constant $\alpha^1$ is present at the second input of the constant multiplier 221, such that $$\alpha^1 (x_1 \cdot s_4 + s_2 \cdot x_3)$$

is provided at the output of the constant multiplier 221.

The output of the constant multiplier 221 is connected to the first input of the XOR circuit 241.

The second output of the subcircuit 211 is connected to the first input of the constant multiplier 231. The constant $\alpha^2$ is present at the second input of the constant multiplier 231, such that $$\alpha^2 (s_1 \cdot s_3 + s_2^2)$$

is provided at the output of the constant multiplier 231.

The output of the constant multiplier 231 is connected to the second input of the XOR circuit 241.

The third output of the subcircuit 211 is connected to the third input of the XOR circuit 241.

The XOR circuit 241 forms for example a component-by-component XORing of the respective m-bit-wide values present at its three inputs and provides the value at its m-bit-wide output, this value being passed to the input of the NOR circuit 25l. The NOR circuit 25l provides at its output $$x^1 = \alpha^1(s_1 \cdot s_4 + s_2 \cdot s_3) = \alpha^2(s_1 \cdot s_3 + s_2^2) + s_2 \cdot s_4 + s_3^2$$

the binary value $BPs_1 = 1$ if $v^l = 0$ holds true
the binary value $BPs_1 = 0$ if $v^l \neq 0$ holds true.

The byte error position signal forming unit $1i$ shown in FIG. 1 comprises
a subcircuit $21i$ having a 4·m-bit-wide input for inputting the components $s_1$, $s_2$, $s_3$ and $s_4$ of the error syndrome $s = s_1$, $s_2$, $s_3$, $s_4$ and three respective m-bit-wide outputs,
a constant multiplier $22i$ having a first m-bit-wide input, a second m-bit-wide input and an m-bit-wide output,
a constant multiplier $23i$ having a first m-bit-wide input, a second m-bit-wide input and an m-bit-wide output,
an XOR circuit $24i$ having three respective m-bit-wide inputs and an m-bit-wide output, and
a NOR circuit $25i$ having an m-bit-wide input and a 1-bit-wide binary output.

The subcircuit $21i$ is configured in such a way that, upon the error syndrome s being input, it outputs $s_1 \cdot s_4 + s_2 \cdot s_3$ at the first output, outputs $s_1 \cdot s_3 + s_2^2$ at the second output and outputs $s_2 \cdot s_4 + s_3^2$ at the third output.

The first output of the subcircuit $21i$ is connected to the first input of the constant multiplier $22i$. The constant $\alpha^i$ is present at the second input of the constant multiplier $22i$, such that $$\alpha^i(s_1 \cdot s_4 + s_2 \cdot s_3)$$

is provided at the output of the constant multiplier $22i$.

The output of the constant multiplier $22i$ is connected to the first input of the XOR circuit $24i$.

The second output of the subcircuit $21i$ is connected to the first input of the constant multiplier $23i$. The constant $\alpha^{2 \cdot i}$ is present at the second input of the constant multiplier $23i$, such that $$\alpha^{2 \cdot i}(s_1 \cdot s_3 + s_2^2)$$

is provided at the output of the constant multiplier $23i$.

The output of the constant multiplier $23i$ is connected to the second input of the XOR circuit $24i$.

The third output of the subcircuit $21i$ is connected to the third input of the XOR circuit $24i$.

The XOR circuit $24i$ forms for example a component-by-component XORing of the respective m-bit-wide values present at its three inputs and provides at its m-bit-wide output $$v^i = \alpha^i(s_1 \cdot s_4 + s_2 \cdot s_3) = \alpha^2(s_1 \cdot s_3 + s_2^2) + s_2 \cdot s_4 + s_3^2$$

which is passed to the input of the NOR circuit $25i$. The NOR circuit $25i$ provides at its output
the binary value $BPs_i = 1$ if $v^i = 0$ holds true and
the binary value $BPs_i = 0$ if $v^i = 0$ holds true.

The byte error position signal forming unit $1N-1$ shown in FIG. 1 comprises
a subcircuit $21N-1$ having a 4·m-bit-wide input for inputting the components $s_1$, $s_2$, $s_3$ and $s_4$ of the error syndrome $s = s_1$, $s_2$, $s_3$, $s_4$ and three respective m-bit-wide outputs,
a constant multiplier $22N-1$ having a first m-bit-wide input, a second m-bit-wide input and an m-bit-wide output,
a constant multiplier $23N-1$ having a first m-bit-wide input, a second m-bit-wide input and an m-bit-wide output,
an XOR circuit $24N-1$ having three respective m-bit-wide inputs and an m-bit-wide output, and
a NOR circuit $25N-1$ having an m-bit-wide input and a 1-bit-wide binary output.

The subcircuit $21N-1$ is configured in such a way that, upon the error syndrome s being input, it
outputs $s_1 \cdot s_4 + s_2 \cdot s_3$ at the first output,
outputs $s_1 \cdot s_3 + s_2^2$ at the second output and
outputs $s_2 \cdot s_4 + s_3^2$ at the second output.

The first output of the subcircuit $21N-1$ is connected to the first input of the constant multiplier $22N-1$. The constant $\alpha^{N-1}$ present at the second input of the constant multiplier $22N-1$, such that $$\alpha^{N-1}(s_1 \cdot s_4 + s_2 \cdot s_3)$$

is provided at the output of the constant multiplier $22N-1$.

The output of the constant multiplier $22N-1$ is connected to the first input of the XOR circuit $24N-1$.

The second output of the subcircuit $21N-1$ is connected to the first input of the constant multiplier $23N-1$. The constant $\alpha^{2 \cdot (N-1)}$ is present at the second input of the constant multiplier $23N-1$, such that $$\alpha^{2 \cdot (N-1)}(s_1 \cdot s_3 + s_2^2)$$

is provided at the output of the constant multiplier $23N-1$.

The output of the constant multiplier $23N-1$ is connected to the second input of the XOR circuit $24N-1$.

The third output of the subcircuit $21N-1$ is connected to the third input of the XOR circuit $24N-1$.

The XOR circuit $24N-1$ forms for example a component-by-component XORing of the respective m-bit-wide values present at its three inputs and provides the value $$v^{N-1} = \alpha^{N-1}(s_1 \cdot s_4 + s_2 \cdot s_3) = \alpha^{2 \cdot (N-1)}(s_1 \cdot s_3 + s_2^2) + s_2 \cdot s_4 + s_3^2$$

at its m-bit-wide output, this value being passed to the input of the NOR circuit $25N-1$. The NOR circuit $25N-1$ provides at its output
the binary value $BPs_{N-1} = 1$ if $v^{N-1} = 0$ holds true and
the binary value $BPs_{N-1} = 0$ if $v^{N-1} \neq 0$ holds true.

Exemplary Combination of the Subcircuits

The subcircuits $210, 211, \ldots, 21i, \ldots, 21N-1$ in FIG. 2 are functionally identical. It is thus possible for these subcircuits to be combined in one subcircuit 31.

FIG. 3 shows such a subcircuit 31 that combines the subcircuits $210, 211, \ldots, 21i, \ldots, 21N-1$. The remaining circuit part shown in FIG. 3 is identical to FIG. 2.

By way of example, the byte error position signal forming units $10, 11, \ldots, 1i, \ldots 1N-1$ in accordance with FIG. 1 can utilize the common subcircuit 31.

Exemplary Implementation of the Subcircuit 31

FIG. 4 shows one possible implementation of the subcircuit 31 illustrated in FIG. 3.

The subcircuit 31 has four respective m-bit-wide inputs for inputting the components $s_1$, $s_2$, $s_3$, $s_4$ which form the syndrome s. Furthermore, provision is made of four multipliers 41, 42, 44 and 47 each having two m-bit-wide inputs and an m-bit-wide output, two squarers 45 and 48 each having an m-bit-wide input and an m-bit-wide output, and three XOR circuits 43, 46 and 49 each having two m-bit-wide inputs and an m-bit-wide output.

The XOR circuits 43, 46, 49 each carry out a component-by-component XORing of the m-component values present at their respective inputs. The multipliers carry out a multiplication in the Galois field $GF(2^m)$, and the squarers square their operands present at the input likewise in the Galois field $GF(2^m)$ The input carrying the component $s_1$ is connected to the first input of the multiplier 41 and to the first input of the multiplier 44.

The input carrying the component $s_2$ is connected to the first input of the multiplier 42, to the first input of the multiplier 47 and to the input of the squarer 45.

The input carrying the component $s_3$ is connected to the second input of the multiplier 42, to the second input of the multiplier 44 and to the input of the squarer 48.

The input carrying the component $s_4$ is connected to the second input of the multiplier 41 and to the second input of the multiplier 47.

The output of the multiplier 41 is passed into the first input of the XOR circuit 43. The output of the multiplier 42 is passed into the second input of the XOR circuit 43. The signal $s_1 s_4 + s_2 s_3$ is provided at the output of the XOR circuit 43.

The output of the multiplier 44 is passed into the first input of the XOR circuit 46. The output of the squarer 45 is connected to the second input of the XOR circuit 46. The signal $s_1 s_3 + s_2^2$ is provided at the output of the XOR circuit 46.

The output of the multiplier 47 is passed into the first input of the XOR circuit 49. The output of the squarer 48 is connected to the second input of the XOR circuit 49. The signal $s_2 s_4 + s_3^2$ is provided at the output of the XOR circuit 49.

Byte Error Correction Values for 2-Byte Errors

FIG. 5 shows an exemplary circuit for forming byte error correction values for a total of N bytes in the case of a 2-byte error. The N bytes considered are numbered from 0 to N−1.

A byte error correction value $a(i)^{cor}$ for the i-th byte where $0 \leq i \leq N-1$ is determined depending on the current error syndrome s, the byte position i and the byte error position signal $BPs_i$ in accordance with $$a(i)^{cor} = BPs_i \cdot a(i).$$

By way of example, byte error correction values are determined for all N byte positions. The byte error correction values are masked for byte positions which are not erroneous. By way of example, the masking can be carried out by multiplying a byte error position signal having the value 0 by the byte error correction value.

If a 2-byte error is present in the byte positions i and j, the i-th and j-th bytes can be corrected by the i-th and j-th bytes being XORed component by component with a corresponding byte error correction value $a(i)^{cor} = a(i) \neq 0$ and respectively $a(j)^{cor} = a(j) \neq 0$.

The bytes which are not erroneous are not corrected. For this purpose, for their byte positions the byte error correction values are set to 0 (e.g. by means of the above-explained multiplication of the byte error correction value by 0) and the correct bytes are then XORed component by component with this value 0. As a result of the XORing with the value 0, the original value remains unchanged.

For the i-th erroneous byte the byte error position signal $BPs_i = 1$ and the following holds true:

$$a(i)^{cor} = BPs_i \cdot a(i) = a(i).$$

For the j-th erroneous byte the byte error position signal $BPs_j = 1$ and the following holds true:

$$a(j)^{cor} = BPs_j \cdot a(j) = a(j).$$

For the k-th, non-erroneous byte where $k \neq i, j$, the byte error position signal $BPs_k = 0$ and the following holds true:

$$a(k)^{cor} = BPs_k \cdot a(k) = 0.$$

If the k-th byte where k i, j is not erroneous, it is not corrected. In accordance with the example shown in FIG. 5 this can be achieved by the k-th byte being XORed component by component with the value 0, such that the value of the k-th byte does not change. The byte error position signal thus masks the byte error correction value as 0, such that no correction is carried out.

If, in the case of a 2-byte error, a first byte error is present in the byte position j and a second byte error is present in the byte position k, the byte error correction values $a(j)^{cor}$ and $a(k)^{cor}$ are not equal to 0, while the byte error correction values $a(i)^{cor}$ for $i \neq j, k$ are in each case equal to 0. It then also holds true that $$BPs_j = BPs_k = 1$$

and $$BPs_i = 0 \text{ for } i \neq j, k.$$

FIG. 5 comprises N byte error position signal forming units 10, 11, ..., 1i, ..., 1N−1 for forming the byte error position signals $BPs_0, BPs_1, ..., BPs_i, ..., BPs_{N-1}$ each having a 4·m-bit-wide (or a 4·m-dimensional) input for inputting the error syndrome s and a 1-bit-wide (or 1-dimensional) output for outputting the byte error position signals $BPs_0, BPs_1, ..., BPs_i, ..., BPs_{N-1}$.

FIG. 5 furthermore shows N byte error correction value forming units 510, 511, ..., 51i, ..., 5N−1 each having a first 1-bit-wide input for inputting a byte error position signal, a second 3·m-bit-wide input for inputting the components $s_1, s_2, s_3$ of the error syndrome s and an m-bit-wide output for outputting one of the byte error correction values $a(0)^{cor}, a(2)^{cor}, ..., a(i)^{cor}, ..., a(N-1)^{cor}$ for the corresponding byte positions.

Furthermore, FIG. 5 comprises N XOR circuits 520, 521, ..., 52i, ..., 52N−1 each having an m-bit-wide first input for inputting the corresponding byte error correction value, a second m-bit-wide input for inputting the corresponding byte to be corrected, and an m-bit-wide output for outputting the respective m-bit-wide corrected bytes.

The current error syndrome s is present at the 4·m-bit-wide input of the byte error position signal forming unit 10. The byte error position signal $BPs_0$ is output at the 1-bit-wide output of the byte error position signal forming unit 10, which is connected to the first input of the byte error correction value forming unit 510.

The components $s_1, s_2, s_3$ of the error syndrome s are present at the second 3·m-bit-wide input of the byte error correction value forming unit 510. The byte error correction value forming unit 510 provides the byte error correction value $a(0)^{cor}$ at its output. The output of the byte error correction value forming unit 510 is connected to the first input of the XOR circuit 520. The possibly erroneous byte value $v'_0$ of the 0-th byte is present at the second input of the XOR circuit 520. The XOR circuit 520 forms the component-by-component XORing of the possibly erroneous byte value $v'_0$ and the byte error correction value $a(0)^{cor}$ and outputs the value $$v'_0 + a(0)^{cor} = v_0^{cor}$$

at its output. The byte error correction value $a(0)^{cor}$ is equal to 0 if the 0-th byte is correct and $BPs_0 = 0$, and is not equal to 0 if the 0-th byte is erroneous and $BPs_0 = 1$.

The current error syndrome s is present at the 4·m-bit-wide input of the byte error position signal forming unit 11. The byte error position signal $BPs_1$ is output at the 1-bit-wide output of the byte error position signal forming unit 11, which is connected to the first input of the byte error correction value forming unit 511.

The components $s_1$, $s_2$, $s_3$ of the error syndrome s are present at the second 3·m-bit-wide input of the byte error correction value forming unit 511. The byte error correction value forming unit 511 provides the byte error correction value $a(1)^{cor}$ at its output. The output of the byte error correction value forming unit 511 is connected to the first input of the XOR circuit 521. The possibly erroneous byte value $v'_1$ of the 1-th byte is present at the second input of the XOR circuit 521. The XOR circuit 521 forms the component-by-component XORing of the possibly erroneous byte value $v'_1$ and the byte error correction value $a(1)^{cor}$ and outputs the value $$v'_1 + a(1)^{cor} = v_1^{cor}$$

at its output. The byte error correction value $a(1)^{cor}$ is equal to 0 if the 1-st byte is correct and $BPs_1 = 0$, and
is not equal to 0 if the 1-st byte is erroneous and $BPs_1 = 1$.

The current error syndrome s is present at the 4·m-bit-wide input of the byte error position signal forming unit $1i$. The byte error position signal $BPs_i$ is output at the 1-bit-wide output of the byte error position signal forming unit $1i$, which is connected to the first input of the byte error correction value forming unit $51i$.

The components $s_1$, $s_2$, $s_3$ of the error syndrome s are present at the second 3·m-bit-wide input of the byte error correction value forming unit $51i$. The byte error correction value forming unit $51i$ provides the byte error correction value $a(i)^{cor}$ at its output. The output of the byte error correction value forming unit $51i$ is connected to the first input of the XOR circuit $52i$. The possibly erroneous byte value $v'_i$ of the i-th byte is present at the second input of the XOR circuit $52i$. The XOR circuit $52i$ forms the component-by-component XORing of the possibly erroneous byte value $v'_i$ and the byte error correction value $a(i)^{cor}$ and outputs the value $$v'_i + a(i)^{cor} = v_i^{cor}$$

at its output. The byte error correction value $a(i)^{cor}$ is equal to 0 if the i-th byte is correct and $BPs_i = 0$, and
is not equal to 0 if the i-th byte is erroneous and $BPs_i = 1$.

The current error syndrome s is present at the 4·m-bit-wide input of the byte error position signal forming unit $1N-1$. The byte error position signal $BPs_{N-1}$ is output at the 1-bit-wide output of the byte error position signal forming unit $1N-1$, which is connected to the first input of the byte error correction value forming unit $51N-1$.

The components $s_1$, $s_2$, $s_3$ of the error syndrome s are present at the second 3·m-bit-wide input of the byte error correction value forming unit $51N-1$. The byte error correction value forming unit $51N-1$ provides the byte error correction value $a(N-1)^{cor}$ at its output. The output of the byte error correction value forming unit $51N-1$ is connected to the first input of the XOR circuit $52N-1$. The possibly erroneous byte value $v'_{N-1}$ of the (N-1)-th byte is present at the second input of the XOR circuit $52N-1$. The XOR circuit $52N-1$ forms the component-by-component XORing of the possibly erroneous byte value $v'_{N-1}$ and the byte error correction value $a(N-1)^{cor}$ and outputs the value $$v'_{N-1} + a(N-1)^{cor} = v_{N-1}^{cor}$$

at its output. The byte error correction value $a(N-1)^{cor}$ is equal to 0 if the (N-1)-th byte is correct and $BPs_{N-1} = 0$, and
is not equal to 0 if the (N-1)-th byte is erroneous and $BPs_{N-1} = 1$.

In this regard, a byte corrector 530 can comprise the byte error position signal forming unit 10 and the byte error correction value forming unit 510, a byte corrector 531 can comprise the byte error position signal forming unit 11 and the byte error correction value forming unit 511, a byte corrector $53i$ can comprise the byte error position signal forming unit $1i$ and the byte error correction value forming unit $51i$ and a byte corrector $53N-1$ can comprise the byte error position signal forming unit $1N-1$ and the byte error correction value forming unit $51N-1$. Correspondingly, the byte correctors 530, 531, ..., $53i$, ..., $53N-1$ can be referred to as byte correctors for 2-byte errors.

In this example, the byte correctors for a 2-byte error output the byte error correction values for those two byte positions which are erroneous. For byte positions having no error, the byte error correction value is equal to 0.

For an erroneous byte position i it holds true that:

$$a(i)^{cor} = a(i).$$

For a byte position j that is not erroneous it holds true that:

$$a(j)^{cor} = 0.$$

In this case, $a(i)$ is the byte error correction value of the i-th byte.

In order to clearly illustrate that the byte error position signal forming units form the corresponding byte error position signal depending on the four components $s_1$, $s_2$, $s_3$, $s_4$ of the error syndrome s and that the byte error correction value forming units form the corresponding byte error correction value depending on the three components $s_1$, $s_2$, $s_3$ of said error syndrome s, FIG. 5 illustrates by way of example two input lines, an input line for inputting the components $s_1$, $s_2$, $s_3$, $s_4$ and a further input line for inputting the components $s_1$, $s_2$, $s_3$. These lines can also be combined for the components $s_1$, $s_2$, $s_3$.

For $r = 0, \ldots, N-1$, a byte error correction value forming unit $51r$ is configured such that it forms at its m-bit-wide output, which is connected to the first m-bit-wide input of an XOR circuit $52r$, in the case of a 2-byte error, the byte error correction value such that the following holds true:

$$a(r)^{cor} = \frac{s_1 s_3 + s_2^2}{s_3 + \alpha^{2r} s_1} \cdot BPs_r.$$

If, in the case of a 2-byte error, the j-th and k-th bytes are erroneous, the byte error correction value forming unit $51j$ outputs the byte error correction value $$a(j)^{cor} = \frac{s_1 s_3 + s_2^2}{s_3 + \alpha^{2j} s_1} = a(j)$$

and the byte error correction value forming unit $51k$ outputs the byte error correction value $$a(k)^{cor} = \frac{s_1 s_3 + s_2^2}{s_3 + \alpha^{2k} s_1} = a(k).$$

For all other byte error correction value forming units $51r$ where $r \neq j, k$ and $0 \leq r \leq N-1$, the byte error correction value is equal to $a(r)^{cor} = 0$.

Byte Error Correction Value Forming Unit

FIG. 6 shows one possible configuration of the byte error correction value forming unit $51r$, wherein r can assume a value of 0 to N-1.

The byte error correction value forming unit 51r comprises two multipliers 61, 66 each having a first and a second m-bit-wide input and an m-bit-wide output, two XOR circuits 63, 64 each having a first m-bit-wide input, a second m-bit-wide input and an m-bit-wide output, a constant multiplier 67 having a first and a second m-bit-wide input and an m-bit-wide output, wherein a constant value $a^{2r}$ is present at the second input, a squarer 62 having an m-bit-wide input and an m-bit-wide output, an inverting circuit 65 having an m-bit-wide input and an m-bit-wide output, and an AND circuit 68 having a 1-bit-wide input, a second m-bit-wide input and an m-bit-wide output.

The value of the component $s_1$ is present at the first input of the multiplier 61 and the value of the component $s_3$ is present at the second input of the multiplier 61. The multiplier 61 forms the value $s_1 \cdot s_3$ in the Galois field $GF(2^m)$ and outputs the value $s_1 \cdot s_3$ at its output. The output of the multiplier 61 is connected to the first input of the XOR circuit 63.

The second input of the XOR circuit 63 is connected to the output of the squarer 62, at the input of which the value of the component $s_2$ is present. Consequently, the squarer 62 outputs the value $s_2^2$ at its output. The XOR circuit 63 forms the component-by-component XORing of the values present at its two inputs and outputs the value $s_1 s_3 + s_2^2$ at its output. The output of the XOR circuit 63 is connected to the first input of the multiplier 66.

The value of the component $s_3$ is present at the first input of the XOR circuit 64. The value of the component $s_1$ is present at the first input of the constant multiplier 67 and the constant $\alpha^{2r}$ is present at the second input of the constant multiplier 67. The constant multiplier 67 realizes the operation $\alpha^{2r} \cdot s_1$ in the Galois field $GF(2^m)$. The constant multiplier can be implemented for example using XOR gates.

At the output of the XOR circuit 64, the value $s_3 + \alpha^{2r} s_1$ is provided and passed to the input of the inverter 65. The inverter 65 provides the value $$\frac{1}{s_3 + \alpha^{2r}}$$

at its output.

The output of the inverter 65 is connected to the first input of the multiplier 66. The multiplier 66 thus provides the value $$\frac{s_1 s_3 + s_2^2}{s_3 + \alpha^{2r} s_1} = a(r)$$

at its output. In this case, a(r) is the byte error correction value for the r-th byte. The value of the byte error position signal $BPs_r$ is present at the first input of the AND circuit 68. The second input of the AND circuit 68 is connected to the output of the multiplier 66.

The AND circuit realizes a bit-by-bit ANDing of the m bits present at its two inputs with the byte error position signal $BPs_r$, such that it provides the value $$\frac{s_1 s_3 + s_2^2}{s_3 + \alpha^{2r} s_1} \cdot BPs_r = a(r) \cdot BPs_r = a(r)^{cor}$$

at its output.

Byte Error Correction Value Forming Unit, Alternative Embodiment

FIG. 7 shows a further possible configuration of the byte error correction value forming unit 51r, which is described for the r-th byte as in FIG. 6, wherein r can assume a value of 0 to (N−1).

The byte error correction value forming unit 51r shown in FIG. 7 comprises three multipliers 71, 75, 76 each having a first m-bit-wide input, a second m-bit-wide input and an m-bit-wide output, two XOR circuits 72, 77 each having an m-bit-wide first input, an m-bit-wide second input and an m-bit-wide output, a constant multiplier 78 having a first m-bit-wide input, a second m-bit-wide input and an m-bit-wide output, wherein a constant value $\alpha^{2r}$ is present at the second input, a squarer 73 having an m-bit-wide input and an m-bit-wide output, two inverters 74, 79 each having an m-bit-wide input and an m-bit-wide output, and an AND circuit 710 having a first 1-bit-wide input, a second m-bit-wide input and an m-bit-wide output.

The value of the component $s_1$ is present at the first input of the multiplier 71 and the value of the component $s_3$ is present at the second input of the multiplier 71. The multiplier 71 forms the value $s_1 \cdot s_3$ in the Galois field $GF(2^m)$ and provides the value $s_1 \cdot s_3$ at its output. The output of the multiplier 71 is connected to the first input of the XOR circuit 72.

The second input of the XOR circuit 72 is connected to the output of the squarer 73, at the input of which the value of the component $s_2$ is present. The squarer 73 thus provides the value $s_2^2$ at its output. The XOR circuit 72 forms the component-by-component XORing of the values present at its two inputs and provides the value $s_1 s_3 + s_2^2$ at its output. The output of the XOR circuit 72 is connected to the input of the inverter 74. The inverter 74 provides the value $$\frac{1}{s_1 s_3 + s_2^2}$$

at its output.

The output of the inverter 74 is connected to the first input of the multiplier 75, at the second input of which the value of the component $s_3$ is present. Furthermore, the output of the inverter 74 is connected to the first input of the multiplier 76, at the second input of which the value of the component $s_1$ is present.

The multiplier 76 provides the value $$\frac{s_1}{s_1 s_3 + s_2^2}$$

at its output. The output of the multiplier 76 is connected to the first input of the constant multiplier 78. The value $\alpha^{2r}$ is present at the second input of the constant multiplier 78. The constant multiplier 78 provides the value $$\frac{\alpha^{2r} s_1}{s_1 s_3 + s_2^2}$$

at its output. The constant multiplier 78 multiplies the value present at its first input by the value of the constant $\alpha^{2r}$ present at its second input in the Galois field $GF2^m$. This multiplication is implemented by corresponding XORings of the bits present at the first input. The constant $\alpha^{2r}$ is uniquely assigned to the r-th byte.

The multiplier 75 provides the value $$\frac{s_3}{s_1 s_3 + s_2^2}$$

at its output. The output of the multiplier 75 is connected to the first input of the XOR circuit 77.

The output of the constant multiplier 78 is connected to the second input of the XOR circuit 77. The XOR circuit 77 provides the value $$\frac{\alpha^{2r} s_1}{s_1 s_3 + s_2^2} + \frac{s_3}{s_1 s_3 + s_2^2} = \frac{\alpha^{2r} s_1 + s_3}{s_1 s_3 + s_2^2}$$

at its output. The output of the XOR circuit 77 is connected to the input of the inverter 79.

The inverter 79 provides the value $$\frac{s_1 s_3 + s_2^2}{\alpha^{2r} s_1 + s_3}$$

at its output. The output of the inverter 79 is connected to the second input of the AND circuit 710.

The value of the byte error position signal $BPs_r$ is present at the first input of the AND circuit 710. The AND circuit 710 realizes a bit-by-bit ANDing of the m bits present at its second input with the byte error position signal $BPs_r$. The AND circuit 710 thus provides the value $$\frac{s_1 s_3 + s_2^2}{s_3 + \alpha^{2r} s_1} \cdot BPs_r = a(r) \cdot BPs_r = a(r)^{cor}$$

at its output.

The part shown in FIG. 7 comprising the multipliers 71, 75, 76, the XOR circuit 72 and the squarer 73 outputs the values $$\frac{s_3}{s_1 s_3 + s_2^2}$$

and $$\frac{s_1}{s_1 s_3 + s_2^2}$$

at the outputs of the multipliers 75 and 76, which values are determined solely by the values of components $s_1$, $s_2$, $s_3$ and are independent of the byte position r. This part of the circuit is identical for all the byte error correction value forming units 510, 511, ..., 51N−1 shown in FIG. 5. It is thus possible to provide this circuit part only once and to utilize the output signals of the multipliers 71, 75 and 76 for all the byte error correction value forming units 510 to 51N−1. For the different byte positions 0 to N−1, it is then only necessary to realize in each case the remaining part 711 of the circuit as shown in FIG. 7, comprising the XOR circuit 77, the constant multiplier 78, the inverter 79 and the AND circuit 710.

One option is to realize a byte error correction value forming unit for correctable byte positions, for example for all correctable byte positions or for a portion of the correctable byte positions using at most three multiplications. In this case, the three multiplications can be implemented using three multipliers. Moreover, one option is to carry out in particular further multiplications by a constant by means of constant multipliers.

Correction of Both 1-Byte and 2-Byte Errors, FIG. 8

FIG. 8 shows one exemplary circuit for correcting 1-byte errors and 2-byte errors, wherein the circuits can be used for determining byte error position signals for 2-byte errors and for correcting 2-byte errors.

The circuit shown in FIG. 8 is configured for example in such a way that a 2-byte error is corrected if a 2-byte error is present,
a 1-byte error is corrected if a 1-byte error is present, and
no correction is carried out if no error is present.

For this purpose, FIG. 8 comprises

N byte error correction value forming units 810, ..., 81i, ..., 81N−1 for correcting 1-byte errors, each having a 2·m-bit-wide input for inputting the components $s_1$, $s_2$ and an m-bit-wide output for outputting an m-bit-wide byte error correction value, N bit correctors 530, ..., 53i, ..., 53N−1 for correcting 2-byte errors, each having a 4·m-bit-wide input for inputting the components $s_1$, $s_2$, $s_3$, $s_4$ and an m-bit-wide output for outputting an m-bit-wide byte error correction value, as described in FIG. 5, N multiplexers 820, ..., 82i, ..., 82N−1, each having a first m-bit-wide input (0-input),
a second m-bit-wide input (1-input),
a 1-bit-wide control input, to which a binary control signal st can be applied, and
an m-bit-wide output, N AND circuits 830, ..., 83i, ..., 83N−1, each having a first 1-bit-wide input for inputting a binary error signal E, a second m-bit-wide input and an m-bit-wide output, and N XOR circuits 840, ..., 84i, ..., 84N−1, each having a first m-bit-wide input, a second m-bit-wide input and an m-bit-wide output.

A line 85 carries the components $s_1$, $s_2$ and is connected to the respective input of the byte error correction value forming units 810, ..., 81i, ..., 81N−1.

A line 86 carries the components $s_1$, $s_2$, $s_3$, $s_4$ and is connected to the respective input of the byte correctors 530, ..., 53i, ..., 53N−1.

In the case of a 1-byte error in the byte position 0, the byte error correction value forming unit 810 provides the correct byte error correction value for the erroneous 0-th byte $v'_0$ at its output. This correspondingly applies to the further byte error correction value forming units. In this regard, in the case of a 1-byte error in the byte position i, the byte error correction value forming unit 81i provides the correct byte error correction value for the erroneous i-th byte $v'_1$ at its output. In the case of a 1-byte error in the byte position (N−1), the byte error correction value forming unit 81N−1 provides the correct byte error correction value for the erroneous (N−1)-th byte $v'_{N-1}$ at its output.

One possible realization of a byte error correction value forming unit for correcting a 1-byte error is explained in association with FIG. 10.

With regard to one possible realization of the byte correctors 530 to 53N−1, reference should be made for example to the byte error position signal forming units described in association with FIG. 2 and the byte error correction value forming units described in association with FIG. 6 and FIG. 7.

The output of the byte error correction value forming unit 810 is connected to the first input of the multiplexer 820. The output of the byte corrector 530 is connected to the second input of the multiplexer 820. If the value of the control signal st is equal to 0, then the multiplexer 820 connects its 0-input (the first input) to its output. If the value of the control signal st is equal to 1, then the multiplexer 820 connects its 1-input (the second input) to its output.

The binary error signal E is present at the first input of the AND circuit 830. The output of the multiplexer 820 is connected to the second input of the AND circuit 830. The output of the AND circuit 830 is connected to the first input of the XOR circuit 840. The possibly erroneous byte $v'_0$ is present at the second input of the XOR circuit 840. The XOR circuit 840 provides the corrected byte value $v_0^{cor}$ at its output.

The AND circuit 830 enables a component-by-component ANDing of the m-digit value present at its second input with the error signal E. If the error signal E=0, the AND circuit 830 outputs the m-component value 0. If the error signal E=1, the AND circuit 830 outputs the value present at its second input.

These explanations correspondingly apply to the remaining byte positions.

The output of the byte error correction value forming unit 81$i$ is connected to the first input of the multiplexer 82$i$. The output of the byte error correction value forming unit 53$i$ is connected to the second input of the multiplexer 82$i$. If the value of the control signal st is equal to 0, then the multiplexer 82$i$ connects its 0-input (the first input) to its output. If the value of the control signal st is equal to 1, then the multiplexer 82$i$ connects its 1-input (the second input) to its output.

The binary error signal E is present at the first input of the AND circuit 83$i$. The output of the multiplexer 82$i$ is connected to the second input of the AND circuit 83$i$. The output of the AND circuit 83$i$ is connected to the first input of the XOR circuit 84$i$. The possibly erroneous byte $v'_i$ is present at the second input of the XOR circuit 84$i$. The XOR circuit 84$i$ provides the corrected byte value $v_i^{cor}$ at its output.

The AND circuit 83$i$ enables a component-by-component ANDing of the m-digit value present at its second input with the error signal E. If the error signal E=0, the AND circuit 83$i$ outputs the m-component value 0. If the error signal E=1, the AND circuit 83$i$ outputs the value present at its second input.

The output of the byte error correction value forming unit 81N−1 is connected to the first input of the multiplexer 82N−1. The output of the byte error correction value forming unit 53N−1 is connected to the second input of the multiplexer 82N−1. If the value of the control signal st is equal to 0, then the multiplexer 82N−1 connects its 0-input (the first input) to its output. If the value of the control signal st is equal to 1, then the multiplexer 82N−1 connects its 1-input (the second input) to its output.

The binary error signal E is present at the first input of the AND circuit 83N−1. The output of the multiplexer 82N−1 is connected to the second input of the AND circuit 83N−1. The output of the AND circuit 83N−1 is connected to the first input of the XOR circuit 84N−1. The possibly erroneous byte $v'_{N-1}$ is present at the second input of the XOR circuit 84N−1. The XOR circuit 84N−1 provides the corrected byte value $v_{N-1}^{cor}$ at its output.

The AND circuit 83N−1 enables a component-by-component ANDing of the m-digit value present at its second input with the error signal E. If the error signal E=0, the AND circuit 83N−1 outputs the m-component value 0. If the error signal E=1, the AND circuit 83N−1 outputs the value present at its second input.

The error signal E assumes the value 1 if a 1-byte error or a 2-byte error has occurred or the value 0 if no error has occurred.

The control signal st assumes the value 0 if a 1-byte error has occurred and the value 1 if a 2-byte error has occurred.

Circuit for Correcting More than Two Byte Errors

FIG. 9 shows a circuit for correcting 1-byte errors, 2-byte errors up to t-byte errors. The elements described in FIG. 8 can correspondingly be used in this circuit.

The circuit shown in FIG. 9 makes it possible that a 1-byte error is corrected if a 1-byte error is present, a 2-byte error is corrected if a 2-byte error is present,

. . .

a t-byte error is corrected if a t-byte error is present, and no correction is carried out if no error is present.

By way of example, the case is described in which a t-byte-error-correcting and (t+1)-byte-error-detecting code is utilized, wherein in particular t>2 holds true.

The circuit in accordance with FIG. 9 comprises the N byte error correction value forming units 810 to 81N−1 in accordance with FIG. 8, the N byte correctors 530 to 53N−1 in accordance with FIG. 8 (as also described in FIG. 5), up to N byte error correction value forming units 910, . . . , 91$i$, . . . , 91N−1 for correcting t-byte errors, each having a 2·m-bit-wide input for inputting the components $s_1, s_2, \ldots, s_{2t}$, and an m-bit-wide output for outputting an m-bit-wide byte error correction value, N multiplexers 920, . . . , 92$i$, . . . , 92N−1, each having a first m-bit-wide input (0-input), a second m-bit-wide input (1-input), up to a t-th m-bit-wide input ((t−1)-input), a control input, at which a control signal st is present, which can assume t different values, and an m-bit-wide output.

N AND circuits 930, . . . , 93$i$, . . . , 93N−1, each having a first 1-bit-wide input for inputting a binary error signal E, a second m-bit-wide input and an m-bit-wide output, and N XOR circuits 940, . . . , 94$i$, . . . , 94N−1, each having a first m-bit-wide input, a second m-bit-wide input and an m-bit-wide output.

The 0-input of one of the multiplexers 920 to 92N−1 is connected to the output thereof if the control signal st has the value 0. Accordingly, a connection of one of the inputs 0 to (t−1) to the output can be produced by virtue of the corresponding control signal st assuming a value of between 0 and (t−1). If st=(t−1)=3 holds true, for example, then the third input (2-input) of the multiplexer is connected to the output thereof.

A line 95 carries the components $s_1, s_2$ and is connected to the respective input of the byte error correction value forming units 810, . . . , 81$i$, . . . , 81N−1.

A line 96 carries the components $s_1, s_2, s_3, s_4$ and is connected to the respective input of the byte correctors 530, . . . , 53$i$, . . . , 53N−1.

Finally, a line 97 is shown, with the aid of which the components $s_1, s_2, \ldots, s_{2t}$ are passed to the respective input of the byte error correction value forming units 910, . . . , 91$i$, . . . , 91N−1.

In the case of a 1-byte error in the byte position 0, the byte error correction value forming unit 810 provides the correct byte error correction value for the erroneous 0-th byte $v'_0$ at its output. This correspondingly applies to the further byte error correction value forming units. In this regard, in the case of a 1-byte error in the byte position i, the byte error correction value forming unit 81i provides the correct byte error correction value for the erroneous i-th byte $v'_1$ at its output. In the case of a 1-byte error in the byte position (N−1), the byte error correction value forming unit 81N−1 provides the correct byte error correction value for the erroneous (N−1)-th byte $v'_{N-1}$ at its output.

In the case of a 2-byte error, the byte corrector 530 provides the correct byte error correction value for the erroneous 0-th byte $v'_0$ at its output. This correspondingly applies to the further byte error correction value forming units. In this regard, in the case of a 2-byte error, the byte error correction value forming unit 53i provides the correct byte error correction value for the erroneous i-th byte $v'_1$ at its output. In the case of a 2-byte error, the byte error correction value forming unit 53N−1 provides the correct byte error correction value for the erroneous (N−1)-th byte $v'_{N-1}$ at its output.

In the case of a t-byte error, the byte error correction value forming unit 910 provides the correct byte error correction value for the erroneous 0-th byte $v'_0$ at its output. This correspondingly applies to the further byte error correction value forming units. In this regard, in the case of a t-byte error, the byte error correction value forming unit 91i provides the correct byte error correction value for the erroneous i-th byte $v'_1$ at its output. In the case of a t-byte error, the byte error correction value forming unit 91N−1 provides the correct byte error correction value for the erroneous (N−1)-th byte $v'_{N-1}$ at its output.

For non-erroneous bytes, the byte error correction values assigned to these byte positions are in each case masked with the value 0.

The output of the byte error correction value forming unit 810 is connected to the first input (0-input) of the multiplexer 920. The output of the byte corrector 530 is connected to the second input (1-input) of the multiplexer 920. Correspondingly, the output of the byte error correction value forming unit 910 is connected to the t-th input ((t−1)-input) of the multiplexer 920.

The binary error signal E is present at the first input of the AND circuit 930. The output of the multiplexer 920 is connected to the second input of the AND circuit 930. The output of the AND circuit 930 is connected to the first input of the XOR circuit 940. The possibly erroneous byte $v'_0$ is present at the second input of the XOR circuit 940. The XOR circuit 940 provides the corrected byte value $v_0^{cor}$ at its output.

The AND circuit 930 enables a component-by-component ANDing of the m-digit value present at its second input with the error signal E. If the error signal E=0, the AND circuit 930 outputs the m-component value 0. If the error signal E=1, the AND circuit 930 outputs the value present at its second input.

These explanations correspondingly apply to the remaining byte positions.

The output of the byte error correction value forming unit 81i is connected to the first input (0-input) of the multiplexer 92i. The output of the byte error correction value 53i is connected to the second input (1-input) of the multiplexer 92i. Correspondingly, the output of the byte error correction value forming unit 91i is connected to the t-th input ((t−1)-input) of the multiplexer 92i.

The binary error signal E is present at the first input of the AND circuit 93i. The output of the multiplexer 92i is connected to the second input of the AND circuit 93i. The output of the AND circuit 93i is connected to the first input of the XOR circuit 94i. The possibly erroneous byte v is present at the second input of the XOR circuit 94i. The XOR circuit 94i provides the corrected byte value $v_i^{cor}$ at its output.

The AND circuit 93i enables a component-by-component ANDing of the m-digit value present at its second input with the error signal E. If the error signal E=0, the AND circuit 93i outputs the m-component value 0. If the error signal E=1, the AND circuit 93i outputs the value present at its second input.

The output of the byte error correction value forming unit 81N−1 is connected to the first input (0-input) of the multiplexer 92N−1. The output of the byte correction value 53N−1 is connected to the second input (1-input) of the multiplexer 92N−1. Correspondingly, the output of the byte error correction value forming unit 91N−1 is connected to the t-th input ((t−1)-input) of the multiplexer 92N−1.

The binary error signal E is present at the first input of the AND circuit 93N−1. The output of the multiplexer 92N−1 is connected to the second input of the AND circuit 93N−1. The output of the AND circuit 93N−1 is connected to the first input of the XOR circuit 94N−1. The possibly erroneous byte V-1 is present at the second input of the XOR circuit 94N−1. The XOR circuit 94N−1 provides the corrected byte value v 1 at its output.

The AND circuit 93N−1 enables a component-by-component ANDing of the m-digit value present at its second input with the error signal E. If the error signal E=0, the AND circuit 93N−1 outputs the m-component value 0. If the error signal E−1, the AND circuit 93N−1 outputs the value present at its second input.

The error signal E assumes the value 1 if a 1-byte error or a 2-byte error, . . . or a t-byte error has occurred or the value 0 if no error has occurred.

The control signal st assumes the value 0 if a 1-byte error has occurred, the value 1 if a 2-byte error has occurred, etc.

the value (t−1) if a t-byte error has occurred.

Byte Error Corrector for 1-Byte Errors

FIG. 10 shows one exemplary circuit for a byte error correction value forming unit 81i for the i-th byte, such as was explained e.g. with reference to FIG. 8.

The byte error correction value forming unit 81i comprises a constant multiplier 101 having a first m-bit-wide input, a second m-bit-wide input, at which the constant value $\alpha^i$ is present, and an m-bit-wide output, an XOR circuit 102 having a first m-bit-wide input, a second m-bit-wide input and an m-bit-wide output, a NOR circuit 103 having an m-bit-wide input and a 1-bit-wide output, an AND circuit 104 having a first 1-bit-wide input, a second m-bit-wide input and an m-bit-wide output.

Furthermore, FIG. 10 shows the multiplexer 82i and the byte error correction value forming unit 53i from FIG. 8 (and FIG. 5).

The constant multiplier 101, the XOR circuit 102 and the NOR circuit 103 form a byte error position signal forming unit 105 and serve for example for forming the byte error position signal $BPs_i^1$, which indicates whether a 1-byte error is present in the i-th byte position.

At the output of the AND circuit 104, the m-dimensional byte error correction value $a(i)^{cor}$ is provided if a 1-byte error has occurred in the byte position i. If the 1-byte error has occurred in another byte position j different than i, the byte error position signal $BPs_j=0$ and the value 0 is thus also present at the output of the AND circuit 104.

The component $s_1$ is present at the first input of the constant multiplier 101 and a constant $\alpha^i$ is present at the second input of the constant multiplier 101. The output of the constant multiplier 101 is connected to the first input of the XOR circuit 102. The component $s_2$ is present at the second input of the XOR circuit 102. The output of the XOR circuit 102 is connected to the input of the NOR circuit 103. The output of the NOR circuit 103 is connected to the first input of the AND circuit 104. The component $s_1$ is present at the second input of the AND circuit 104. The output of the AND circuit 104 is connected to the first input of the multiplexer 82i.

The second input of the multiplexer 82i is connected to the output of the byte error correction value forming unit 53i.

Consequently, the byte error correction value for a 1-byte error is provided at the first input of the multiplexer 82i and the byte error correction value for a 2-byte error is provided at the second input of the multiplexer 82i.

Correspondingly, the control signal st for the multiplexer 82i is equal to 0 if a 1-byte error is present, in order to connect the first input (0-input) of the multiplexer 82i to the output thereof, or equal to 1 if a 2-byte error is present, in order to connect the second input (1-input) of the multiplexer 82i to the output thereof.

If no error is present, the value of the control signal st is arbitrary. It can be fixed at 0, for example, as is described by way of example below.

If no error is present, the value of the error signal E is equal to 0. This was explained above in association with FIG. 8. On the basis of the AND circuit 83i connected downstream, which logically ANDs the signal at the output of the multiplexer 82i component by component with the error signal E, it is ensured that in the case of an error signal E=0 (that is to say if no error is present) the value 0 is provided at the output of the AND circuit 83i, to be precise independently of the signal at the output of the multiplexer 82i. Consequently, no correction of the i-th byte is carried out.

Circuit for Determining an Error Signal

FIG. 11 shows one exemplary circuit for determining the error signal E such as is utilized for example in the circuit shown in FIG. 8.

The arrangement shown in FIG. 11 comprises a multiplier 111 having a first m-bit-wide input, a second m-bit-wide input and an m-bit-wide output, an XOR circuit 113 having a first m-bit-wide input, a second m-bit-wide input and an m-bit-wide output, a squarer 112 having an m-bit-wide input and an m-bit-wide output, an OR circuit 114 having an m-bit-wide input and a 1-bit-wide output, an OR circuit 116 having an m-bit-wide input and a 1-bit-wide output, and an OR circuit 115 having a first binary input, a second binary input and having a binary output.

The value of the component $s_1$ is present at the first input of the multiplier 111. The value of the component $s_3$ is present at the second input of the multiplier 111. The output of the multiplier 111 is connected to the first input of the XOR circuit 113.

The component $s_1$ is also present at the input of the OR circuit 116. The output of the OR circuit 116 is connected to the second input of the OR circuit 115.

The component $s_2$ is present at the input of the squarer 112. The output of the squarer 112 is connected to the second input of the XOR circuit 113.

The output of the XOR circuit 113 is connected to the input of the OR circuit 114 and the output of the OR circuit 114 is connected to the first input of the OR circuit 115.

The control signal st is provided at the output of the OR circuit 114 and the error signal E is provided at the output of the OR circuit 115.

The control signal st assumes the value 0 if the following holds true:

$$s_1 s_3 + s_2^2 = 0.$$

Correspondingly, the control signal st assumes the value 1 if the following holds true:

$$s_1 s_3 + s_2^2 \neq 0.$$

The error signal E assumes the value 0 if the control signal st is equal to 0 and if the value of the component $s_1$ is equal to 0. In this case, neither a 1-byte error nor a 2-byte error is present.

If the value of the control signal st is equal to 1, a 2-byte correction using the byte correctors 530 to 53N−1 is carried out in the circuit in accordance with FIG. 8.

If the value of the control signal st is equal to 0, firstly a 1-byte correction using the byte error correction value forming units 810 to 81N−1 is carried out in the circuit in accordance with FIG. 8. If the error signal E is also equal to 0, such that neither a 1-byte error nor a 2-byte error is present, the AND circuits 830 to 83N−1 all output the value 0, such that no correction of the bytes $v'_0$ to $v'_{N-1}$ is carried out.

If a 3-byte error is detected, the error correction can be terminated, for example. Such a termination of the error correction can be carried out at the system level.

Circuit for Detecting a 3-Byte Error

FIG. 12 shows one exemplary circuit for detecting a 3-byte error. For this purpose, the circuit comprises four multipliers 121, 122, 123, 124, each having a first m-bit-wide input, a second m-bit-wide input and an m-bit-wide output, three squarers 125, 126, 127, each having an m-bit-wide input and an m-bit-wide output, three XOR circuits 128, 129, 1210, each having a first m-bit-wide input, a second m-bit-wide input and an m-bit-wide output, and an OR circuit 1211 having an m-bit-wide input and a binary output, wherein the OR circuit 1211 carries out a component-by-component ORing of the m bits present at its input.

The value of the component $s_1$ is present at the first input of the multiplier 121 and at the second input of the multiplier 123.

The value of the component $s_2$ is present at the input of the squarer 126.

The value of the component $s_3$ is present at the input of the squarer 125 and at the second input of the multiplier 122.

The value of the component $s_4$ is present at the input of the squarer 127.

The value of the component $s_5$ is present at the second input of the multiplier 121 and at the first input of the multiplier 124.

The output of the multiplier 121 is connected to the first input of the XOR circuit 128. The output of the squarer 125 is connected to the second input of the XOR circuit 128. The output of the XOR circuit 128 is connected to the first input of the multiplier 122. The output of the multiplier 122 is connected to the first input of the XOR circuit 129.

The output of the squarer 127 is connected to the first input of the multiplier 123. The output of the multiplier 123 is connected to the first input of the XOR circuit 1210.

The output of the squarer 126 is connected to the second input of the multiplier 124 and the output of the multiplier 124 is connected to the second input of the XOR circuit 1210. The output of the XOR circuit 1210 is connected to the second input of the XOR circuit 129. The output of the XOR circuit 129 is connected to the input of the OR circuit 1211 and a signal Err3 is available at the output of the OR circuit 1211, on the basis of which signal a 3-byte error can be determined.

The signal Err3 assumes the value 1 if the following holds true:

$$(s_1 s_5 + s_3^2) \cdot s_3 + s_2^2 s_5 + s_4^2 s_1 = s_1 s_3 s_5 + s_3^3 + s_2^2 s_5 + s_4^2 s_1 \neq 0.$$

Correspondingly, the signal Err3 assumes the value 0 if the following holds true:

$$(s_1 s_5 + s_3^2) \cdot s_3 + s_2^2 s_5 + s_4^2 s_1 = 0.$$

The invention claimed is:

1. A circuit arrangement for determining in parallel at least two byte error position signals for identifying at least one byte error in a binary sequence comprising a plurality of bytes, wherein the binary sequence in an error-free case is a code word of an error code, each of the at least two byte error position signals is determinable using components of an error syndrome of the error code to indicate whether a byte of the binary sequence that is associated with the at least two byte error position signals is erroneous.

2. The circuit arrangement as claimed in claim 1, wherein configured such that byte error position signals are determinable using components of an error syndrome of the error code such that the components indicate, for at least two bytes of the bytes of the binary sequence, that a correctable error is present.

3. The circuit arrangement as claimed in claim 1, wherein the error code is a t-byte-error-correcting code, and at least (t+1) byte error position signals are determined in parallel.

4. The circuit arrangement as claimed in claim 1, wherein the binary sequence has a 2-byte error.

5. The circuit arrangement as claimed in claim 1, wherein each byte of the binary sequence has m bits, wherein m 2.

6. The circuit arrangement as claimed in claim 1, wherein the error code is
   a t-byte-error-correcting code or
   a t-byte-error-correcting and (t+1)-byte-error-detecting code,
   wherein $t \geq 2$.

7. The circuit arrangement as claimed in claim 6, wherein the binary sequence has at least (t+1) correctable bytes.

8. The circuit arrangement as claimed in claim 6, wherein the error syndrome has at least 2 t components $s_1, s_2, \ldots, s_{2t}$, and each component comprises in each case m bits where $m \geq 2$.

9. The circuit arrangement as claimed in claim 1, wherein the at least two byte error position signals have a first value if the byte associated with the byte error position signal is erroneous, and have a second value if the byte associated with the at least two byte error position signals not erroneous.

10. The circuit arrangement as claimed in claim 1, wherein at least one of byte error position signals is determined for at least one correct byte.

11. The circuit arrangement as claimed in claim 1, wherein the binary sequence comprises data bytes and check bytes, and the data bytes or the check bytes form correctable bytes.

12. A circuit arrangement for correcting at least one byte error in a binary sequence comprising a plurality of bytes, wherein the binary sequence in an error-free case is a code word of an error code, and wherein the circuit arrangement is configured to determine at least one byte error position signal using components of an error syndrome of the error code such that by means of the at least one byte error position signal it is determinable whether a byte of the binary sequence is erroneous, and configured to determine at least one byte error correction value on the basis of which an erroneous byte position identified by means of the at least one byte error position signal is correctable, and the at least one byte error correction value is determined for at least one correct byte.

13. The circuit arrangement as claimed in claim 12, wherein the at least one byte error position signal or at least one byte error correction value are determined in parallel.

14. The circuit arrangement as claimed in claim 13, wherein the error code is a t-byte-error-correcting code, and at least (t+1) byte error position signals are determined in parallel.

15. The circuit arrangement as claimed in claim 13, wherein the error code is a t-byte-error-correcting code, and at least (t+1) byte error correction values are determined in parallel.

16. The circuit arrangement as claimed in claim 15, wherein the at least (t+1) byte error correction values are determined using at most three Galois field multipliers, and wherein $t \geq 2$.

17. The circuit arrangement as claimed in claim 12, wherein the circuit arrangement is configured to correct the at least one byte error by logically combining the at least one byte error position signal with the at least one byte error correction value for the erroneous byte.

18. The circuit arrangement as claimed in claim 12, wherein the circuit arrangement is configured to correct t-byte errors, wherein $t \geq 2$.

19. The circuit arrangement as claimed in claim 18, wherein the circuit arrangement is additionally configured to correct 1-byte errors.

20. The circuit arrangement as claimed in claim 18, wherein the circuit arrangement is additionally configured to correct τ-byte errors, wherein $t \geq \tau > 2$.

21. The circuit arrangement as claimed in claim 12, wherein, in a case of a 2-byte error, an i-th byte is a correctable byte,
   the at least one byte error position signal for the i-th byte assumes a first value if $$\alpha^{2i}\{s_1 s_3 + s_2^2\} \alpha^i \{s_1 s_4 + s_2 s_3\} + s_2 s_4 + s_3^2 = 0$$

the at least one byte error position signal for the i-th byte assumes a second value if $$\alpha^{2i}\{s_1 s_3 + s_2^2\} \alpha^i \{s_1 s_4 + s_2 s_3\} + s_2 s_4 + s_3^2 \neq 0, \text{ and}$$

the i-th byte is erroneous if the at least one byte error position signal associated with the i-th byte assumes the first value.

22. The circuit arrangement as claimed in claim 12, wherein, in case of a 2-byte error, a byte error correction value of an i-th byte is determined in accordance with $$a(i) = \frac{s_1 s_3 + s_2^2}{s_3 + \alpha^{2i} s_1}.$$

23. The circuit arrangement as claimed in claim 12, wherein, in a case of a 2-byte error, the correction of a correctable byte is determined depending on three components of the error syndrome and on the at least one byte error position signal.

24. A method for determining in parallel at least two byte error position signals for identifying at least one byte error in a binary sequence comprising a plurality of bytes, wherein the binary sequence in an error-free case is a code word of an error code, and each of the at least two byte error position signals is determined using components of an error syndrome of the error code such that the components indicate whether a byte of the binary sequence that is associated with the at least two byte error position signals is erroneous.

25. A method for correcting at least one byte error in a binary sequence comprising a plurality of bytes, wherein the binary sequence in an error-free case is a code word of an error code, the method comprising:
- determining at least one byte error position signal using components of an error syndrome of the error code such that, owing to the at least one byte error position signal, it is determinable whether a byte of the binary sequence is erroneous; and
- determining at least one byte error correction value on the basis of which an erroneous byte position identified by means of the at least one byte error position signal is corrected,
- wherein at least one of the byte error correction values is determined for at least one correct byte.

* * * * *